(12) United States Patent
Ostertun

(10) Patent No.: US 11,941,281 B2
(45) Date of Patent: Mar. 26, 2024

(54) NON-VOLATIVE MEMORY SYSTEM CONFIGURED TO MITIGATE ERRORS IN READ AND WRITE OPERATIONS

(71) Applicant: NXP B.V., Eindhoven (NL)

(72) Inventor: Soenke Ostertun, Wedel (DE)

(73) Assignee: NXP B.V., Eindhoven (NL)

(*) Notice: Subject to any disclaimer, the term of this patent is extended or adjusted under 35 U.S.C. 154(b) by 68 days.

(21) Appl. No.: 17/711,968

(22) Filed: Apr. 1, 2022

(65) Prior Publication Data

US 2023/0315325 A1 Oct. 5, 2023

(51) Int. Cl.
*G06F 3/06* (2006.01)

(52) U.S. Cl.
CPC ............ *G06F 3/065* (2013.01); *G06F 3/0616* (2013.01); *G06F 3/0658* (2013.01); *G06F 3/0679* (2013.01)

(58) Field of Classification Search
None
See application file for complete search history.

(56) References Cited

U.S. PATENT DOCUMENTS

| | | |
|---|---|---|
| 8,351,174 B1 | 1/2013 | Gardner et al. |
| 8,499,192 B2 | 7/2013 | Rousseau |
| 2007/0028035 A1 | 2/2007 | Nishihara |
| 2015/0278104 A1* | 10/2015 | Moon ................... G06F 3/0656 711/135 |
| 2017/0285996 A1 | 10/2017 | Ostertun et al. |
| 2018/0113636 A1* | 4/2018 | Kwon ................... G06F 3/0619 |
| 2020/0133765 A1 | 4/2020 | Novak et al. |

FOREIGN PATENT DOCUMENTS

| | | | |
|---|---|---|---|
| JP | 2012-58840 A | 3/2012 | |
| WO | WO-2004001606 A1 * | 12/2003 | ......... G06F 12/0246 |
| WO | WO-2019239886 A1 * | 12/2019 | ............ H04W 48/14 |

OTHER PUBLICATIONS

Y Wang & al., IEEE: 5458941—Stable In-circuit Programming of Flash Memory in Freescale's MC9S12 MCU Family Mar. 13-14, 2010, 4 pages.

* cited by examiner

*Primary Examiner* — Kevin Verbrugge

(57) ABSTRACT

A system and method for a memory system are provided. A memory device includes an array of non-volatile memory cells. A memory controller is connected to the array of non-volatile memory cells. The memory controller is configured to perform the steps of receiving a request to read a value of a memory flag, wherein the memory flag includes a 2-bit value stored in a first memory cell and a second memory cell of the array of non-volatile memory cells, reading a first value of the first memory cell, reading a second value of the second memory cell, and determining the value of the memory flag based on the first value and the second value. In embodiments, the memory flag may have more than 2-bits.

16 Claims, 8 Drawing Sheets

| L/F/R | FLAG VALUE | FURTHER STEPS |
|---|---|---|
| 101 | 0 | NO |
| X01 as 101 | 0 | NO; NEXT OPERATION WILL UPDATE/FIX L |
| X01 as 001 | $X_L$ | RESOLVE L vs. F / MARGIN-0 SHMOO |
| 0X1 as 001 | $X_L$ | RESOLVE L vs. F / MARGIN-0 SHMOO |
| 0X1 as 011 | $X_R$ | RESOLVE F vs. R / MARGIN-1 SHMOO |
| 01X as 011 | $X_R$ | RESOLVE F vs. R / MARGIN-1 SHMOO |
| 01X as 010 | 1 | NO; NEXT OPERATION WILL UPDATE/FIX R |
| 010 | 1 | NO |

NON-VOLATILE MEMORY SYSTEM CONFIGURED TO MITIGATE ERRORS IN READ AND WRITE OPERATIONS

TECHNICAL FIELD

Embodiments of the subject matter described herein relate generally to electronic memory systems, and more particularly to memory systems configured to implement system-level atomic flags to mitigate risks of read and write errors due to tearing events.

BACKGROUND

Many devices use nonvolatile memory to store information that is later updated or changed. For example, smart card systems use nonvolatile memories in small embedded integrated circuits (e.g., embedded in a pocket-sized card) to store regularly updated information. This arrangement allows for advanced functionality such as payment, data storage, or authentication functions to be implemented by the smart card. Typically, in order to update the information stored in nonvolatile memory on such devices, the devices communicate with a data source using either in-contact or contactless communication technologies. In some circumstances (e.g., when processing a transaction or status changes), information can be updated via exchange of a relatively small amount of data between the smart card and the data source. Such data exchanges may occur quickly and in a short amount of time. In other circumstances, such as a software or operating system update, larger amounts of data may be transferred to the smart card by the data source. Depending upon the data reception capabilities of the smart card and the data transmission capabilities of the data source, such data transfers can require a relatively long period of time (e.g., several seconds or minutes) for the data transfer to complete. If, during any data transfer, power loss at either the smart card or the data source occurs, the data transfer can become corrupted resulting in improper smart card operation.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 12 is a chart displaying a summary of how a 3-bit atomic flag would be read given particular values for each of the three bits.

DETAILED DESCRIPTION

Figure 1:
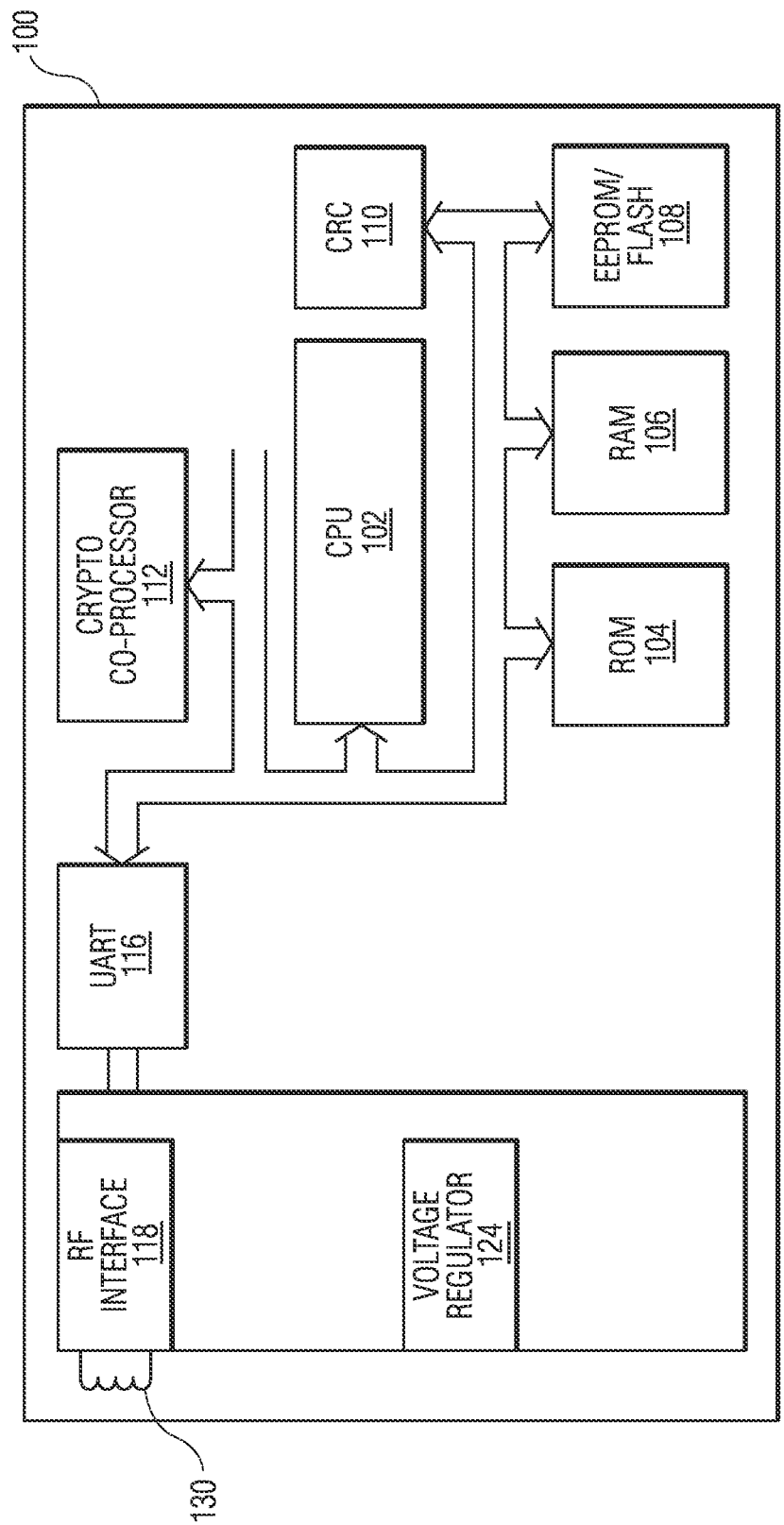
FIG. 1 is a block diagram depicting functional components of a contactless smart card.

It will be readily understood that the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

For simplicity, the described features, advantages, and characteristics of the invention are described throughout this specification may be described as being implemented within a smart card or other similar piece of electronic equipment, but could instead be implemented in other devices that utilize non-volatile memory to store and update information.

In a typical embodiment, aspects of the present invention may be implemented within a device including a processor or microcontroller and a memory device, such as a smart card device. FIG. 1 is a block diagram of contactless smart card 100. The smart card includes a CPU 102, and a memory subsystem that may include a read only memory (ROM) 104. Typically, CPU 102 can read from ROM 104, but is unable to write-to or otherwise modify data stored in ROM 104. ROM 104 may store software comprising a basic input-output system (BIOS) enabling hardware components of contactless smart card 100 to operate. The memory system of contactless smart card 100 includes random access memory (RAM) 106. CPU 102 is configured to store data into, modify data in, and retrieve data from RAM 106. RAM 106 may be a volatile memory system in that when contactless smart card 100 loses power, data stored in RAM 106 may be lost.

The memory system of contactless smart card 100 further includes electronically erasable programmable read-only memory (EEPROM)/Flash memory 108. CPU 102 is configured to read data from and write data into EEPROM/Flash memory 108. EEPROM/Flash memory 108 is a non-voltage memory system so that data written into EEPROM/flash memory 108 is retained when contactless smart card 100 is power cycled.

In various embodiments, contactless smart card 100 includes a cyclic redundancy checker (CRC) 110 to assist in detection of errors in data retrieved from any of the memory subsystems, a crypto co-processor 112 to encrypt or decrypt data, and a Universal Asynchronous Receiver/Transmitter (UART) 116 that interfaces with an RF interface 118 for data transmission and reception, an RF antenna 130, and voltage regulator 124 to regulate electrical power supplied to the components of contactless smart card 100. In other embodiments, the smart card device shown as contactless smart card 100 can be emulated by a computing device, such as a smart phone, or can be embedded in a larger device (e.g., a mobile phone or larger electronic device).

A memory system may be implemented by an array of memory cells, where each memory cell is configured to store a value. The memory cells may be implemented in any suitable manner, but may typically be configured as one or more logic gates configured in a "NAND" or "NOR" layout. Within the memory system, each memory cell includes a number of terminals enabling the memory cell to be programmed to a desired value or condition or to be read. Typically, the terminals include gate terminals for each memory cell. The gate terminals are typically coupled by rows to word select lines and the memory cells' drain terminals are coupled to column bit lines. Memory cells are programmed to a desired state by placing an electric charge on or removing an electric charge from the floating gate of a memory cell to put the cell into one of a number of stored states corresponding to different charge states of the memory cell. For example, a single memory cell can represent two binary states, e.g., 1 or 0, where the values are associated with different stored charges of the memory cell. If the stored charge is above the threshold, the memory cell is programmed to a first value or condition and if the stored charge is below the threshold, the memory cell is programmed to a second value or condition.

The reading of such memory cells can be accomplished by applying appropriate read voltages to a cell's control gate terminal and drain and comparing the drain to source current, which can indicate the voltage threshold (Vt) of the cell, against a reference current, e.g., a "trip point," to determine the state of the memory cell. In an example data read operation, 0 volts can be applied to a selected word line, e.g., to the control terminal of a memory cell or memory cells in the selected word line. A read pass voltage of about 5 volts can be applied to unselected word lines, e.g., to the control gate terminals of memory cells in the unselected word lines. The drain-to-source current, e.g., the "cell current," or "drain current," flowing through cells on the selected word line, is then indicative of the binary logic state of or the value stored by the cell.

As such, when the cell current of a particular memory cell is above the trip point, the memory cell is read as having a first state associated with a first value. When the cell current of the particular memory cell is below the trip point, the memory cell is read as having a different state or value.

Figure 2:
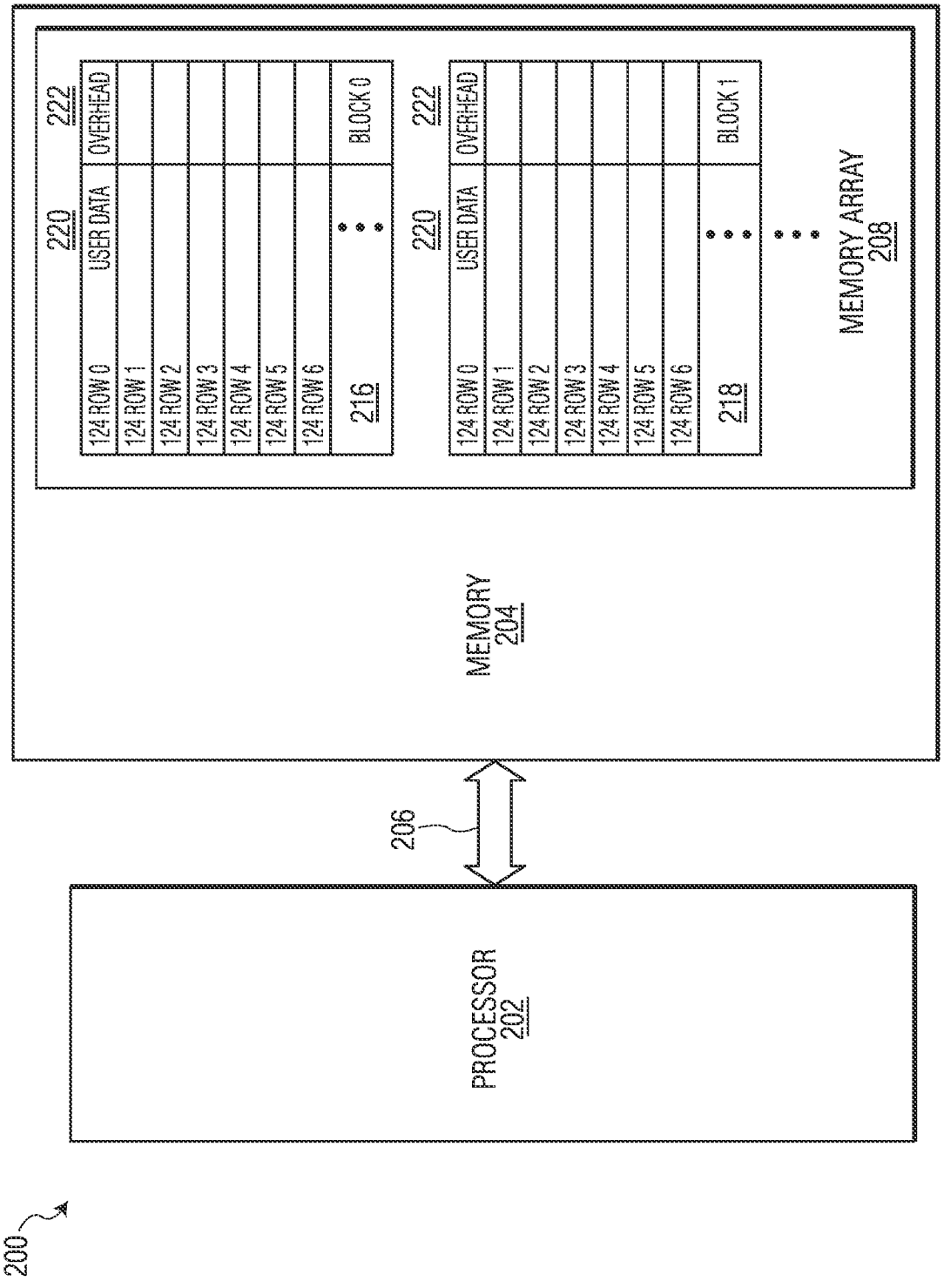
FIG. 2 is a block diagram depicting functional components depicting an electronic device including a memory system, where the memory system may be incorporated into the contactless smart card of FIG. 1.

To illustrate the operation of such memory, FIG. 2 is a block diagram of an electronic system 200 having a memory device 204 (e.g., memory system of contactless smart card 100 of FIG. 1) in accordance with an embodiment of the present disclosure. In the system 200, the memory device 204 is coupled to a processor 202 via an address/data bus 206.

The memory array 208 contains floating gate memory cells arranged in a sequence of memory blocks 216, 218. The blocks 216, 218 contain a series of physical pages/rows (shown as "Row 0," "Row 1," etc.), each page containing one or more logical sectors (shown here for illustration purposes as a single logical sector per physical page/row) that contain a user data space sector 220 and a control/overhead data space 222 (shown as "OVERHEAD"). The overhead data space 222 contains overhead information for operation of the sector 220, such as an error correction code (ECC), status flags, or an erase block management data field area (not shown).

Figure 3:
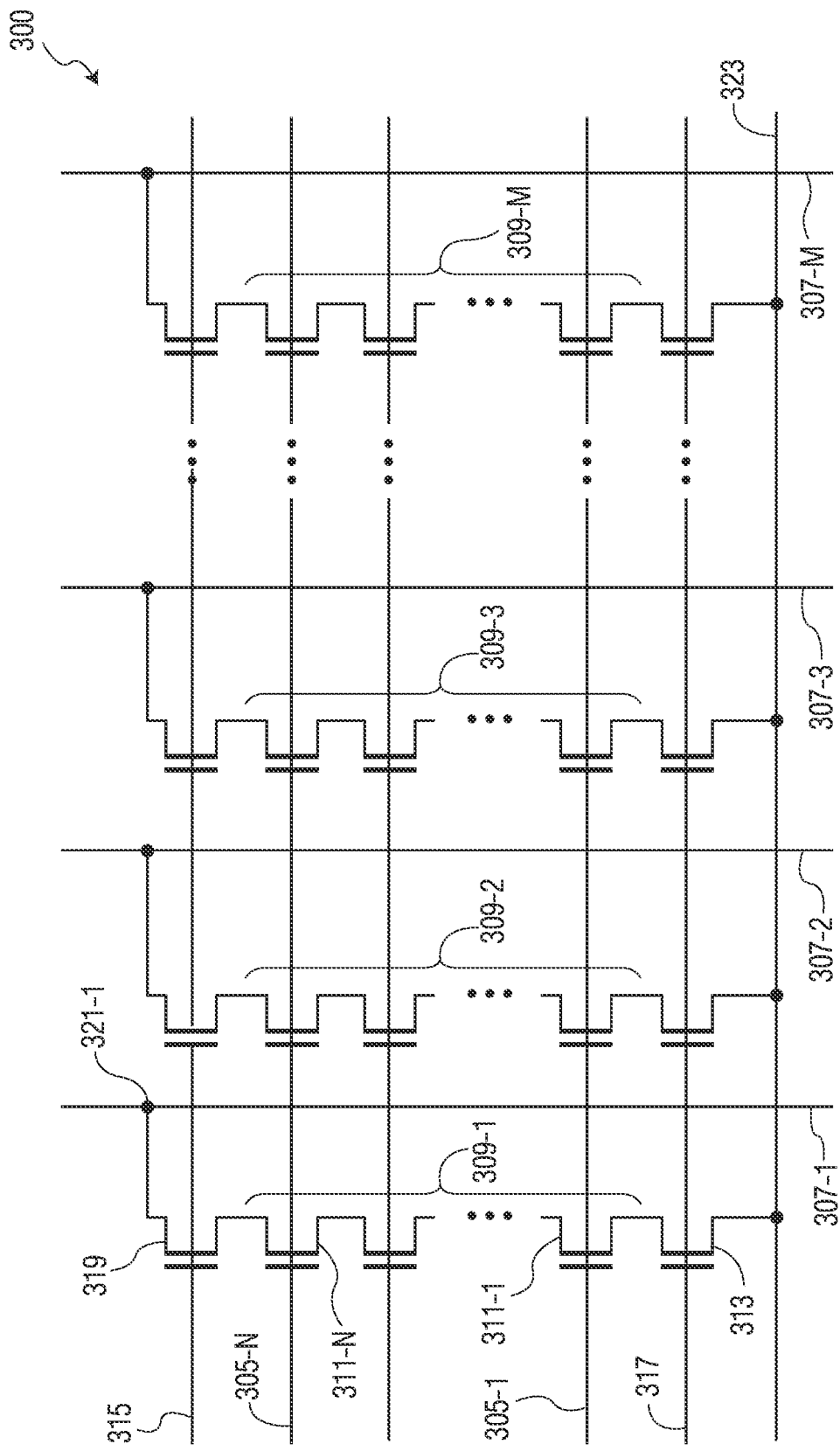
FIG. 3 is a circuit diagram depicting a portion of a NAND memory array that may form part of the memory array of FIG. 2

FIG. 3 is a schematic illustrating a portion of a NAND memory array 300 that may form part of memory array 208 of FIG. 2. As shown in FIG. 3, memory array 300 includes word lines 305-1, . . . , 305-N and intersecting bit lines 307-1, . . . , 307-M.

Memory array 300 includes NAND strings 309-1, . . . , 309-M. Each NAND string includes non-volatile memory cells 311-1, . . . , 311-N, each located at an intersection of a word line 305-1, . . . , 305-N and a local bit line 307-1, . . . , 307-M. The non-volatile memory cells 311-1, . . . , 311-N of each NAND string 309-1, . . . , 309-M are connected in series source to drain between a source select gate, e.g., a field-effect transistor (FET) 313, and a drain select gate, e.g., FET 319. Source select gate 313 is located at the intersection of a local bit line 307-1 and a source select line 317 while drain select gate 319 is located at the intersection of a local bit line 307-1 and a drain select line 315.

As shown in the embodiment illustrated in FIG. 3, a source of source select gate 313 is connected to a common source line 323. The drain of source select gate 313 is connected to the source of the memory cell 311-1 of the corresponding NAND string 309-1. The drain of drain select gate 319 is connected to the local bit line 307-1 for the corresponding NAND string 309-1 at drain contact 321-1. The source of drain select gate 319 is connected to the drain of the last memory cell 311-N, e.g., floating-gate transistor, of the corresponding NAND string 309-1.

In various embodiments, construction of non-volatile memory cells, 311-1, . . . , 311-N, includes a source, a drain, a floating gate or charge storage layer, and a control gate. Non-volatile memory cells, 311-1, . . . , 311-N, have their control gates coupled to a word line, 305-1, . . . , 305-N respectively. A column of the non-volatile memory cells, 311-1, . . . , 311-N, make up the NAND strings, e.g., 309-1, . . . , 309-M, coupled to a given local bit line, e.g., 307-1, . . . , 307-M respectively. A row of the non-volatile memory cells are commonly coupled to a given word line, e.g., 305-1, . . . , 305-N. An AND array architecture would be similarly laid out except that the string of memory cells would be coupled in parallel between the select gates.

During a read operation, a word line voltage (WVL) of 0 volts is applied to the word line of a memory cell to be read, e.g., a cell whose current state is to be determined. In this example, a VWL of 0 volts can be applied to word line 305-1 in the NAND string to read memory cell 311-1.

In order to determine the current state of a memory cell, e.g., cell 311-1, a read voltage (Vread) is applied to the word or read lines of other cells, e.g., cells adjacent the memory cell being read, in the NAND string to turn those cells on. For this reason, Vread can be referred to as a read pass voltage. The word line of the memory cell being read is referred to as a selected word line, while the adjacent word lines are referred to as unselected word lines.

Under these conditions, the voltage threshold (Vt) and/or drain current (cell current), which is indicative of the binary state of the memory cell 311-1, can be determined, e.g., whether the drain current is above or below the trip point. Generally, the memory cell 311-1 will be conductive if the stored gate voltage for the cell exceeds a predetermined threshold value. If the stored gate voltage for the cell falls below that predetermined threshold value, the cell will not be conductive and will be assigned a value of '0' or be designated as cleared. In some cases it is possible to apply a bias voltage to the gate terminal to determine whether the memory cell 311-1 is conductive at higher or lower gate voltages. These techniques can be referred as performing margin reads and may be utilized to determine how strongly the memory cell 311-1 is programmed to a particular value (e.g., how far away the memory cell's gate voltage is from the threshold voltage). In the embodiment illustrated in FIG. 3, a Vread is applied to word lines 305-2, . . . , 305-N in order to read cell 311-1 on word line 305-1. In various embodiments of the present disclosure, other read voltages may be used. Embodiments are not limited to this example.

In typical memory systems, non-volatile memory subsystems (e.g., such as EEPROM/Flash memory 108 of contactless smart card 100) are implemented to mitigate the risk of interruptions while one or more memory cells of the memory subsystem are being written to or otherwise updated. Interruptions may include unforeseen power losses, such as due to power supply of the system being disconnected or being positioned too far from contactless smart card 100, or other device failure.

If such an interruption occurs while a memory cell is being written-to or programmed, upon being turned back on, the system cannot determine whether that programming operation was successfully completed and therefore cannot determine whether the value stored in that memory cell is accurate. Such events can be referred to as brown-out or tearing events and can result in large portions of a device's memory subsystem containing data or values that are not trustworthy. These tearing events can be problematic and may occur in electronic devices that rely on power supplied via the device's proximity to an RF field (e.g., smartcards or RFID tags). If a user holding the smartcard or RFID tag should accidentally move the smartcard or RFID tag away from the power source during a data write operation, data stored in the smartcard of RFID tag could become corrupted.

Some techniques for the mitigation of tearing events rely on a device's memory subsystem exhibiting monotonic programming behavior in which the data writing process only ever involves a constantly increasing memory cell charge (e.g., in the case of writing a '1' value to the memory cell) or a constantly decreasing memory cell charge (e.g., in the case of writing a '0' value to the memory cell). These techniques, however, are not as effective when utilized in conjunction with memory systems that exhibit non-monotonic behavior. For example, these techniques may not work well with some emerging non-volatile memory systems like phase-change or resistive RAMs that have a more stochastical or non-monotonic programming behavior. The behavior of these systems in response to a tearing event can be difficult to predict.

The present disclosure therefore provides a method to detect and resolve tearing conditions without being limited to memory systems that exhibit monotonic programming behavior.

Within an electronic device (e.g., contactless smart card 100 of FIG. 1), the device may perform automated routines by executing software applications, such as memory updates, that can sometimes involve the transfer and processing of relatively large amounts of data (e.g., a firmware update). When performing a memory update, for example, sufficient memory is required to create and store two versions of the data being updated—a backup copy of the original data set and a copy of the new data set that will overwrite the original dataset. Consequently, these memory updates can require multiple memory read/write operation operations: creating a backup copy of the original data, storing related meta-information, updating a target memory location with the new data, and deleting or otherwise invalidating the old or backup information. These updates occur sequentially over time and, as such, any of these individual updates to memory can get interrupted by a tearing event.

Consequently, when a system that was undergoing a memory update powers back up after a tearing event, the system should be able to detect at what point during the memory update process the tearing event occurred. This allows the system to better determine the outcome of the interrupted memory update process and then take appropriate action. For example, the system should be able to distinguish whether the tearing event happened during backup creation or after backup creation was completed and during the memory update itself. If the tearing event occurred during the backup creation process, the system can make the determination that the old, original memory content is uncorrupted, but that the backup file is potentially incomplete or corrupted. In that case the entire memory update operation can be re-executed. However, if the system determines that the tearing event occurred during the memory update process, the system can determine that the main memory location may contain incomplete or corrupted data, and that the backup should be restored to ensure a fully consistent system.

The system can determine in which stage of the memory update process the tearing event occurred by establishing a memory update flag in memory where the flag is set (e.g., to a value of '1') after the backup file has been completed. The flag can then be cleared (e.g., set to a value of '0') when the memory update is completed. By clearing the flag, the backup file can be determined to be unnecessary and can be erased and the memory location storing the backup data can then be used for future memory operations.

This memory update process presumes that the flag resides in non-volatile memory and itself stores a value that is valid and can be relied upon even after a system power loss. Consequently, there may still be some risk that the process of updating the flag (e.g., after the back-up file has been created) could itself suffer from a tearing event. The following examples illustrate how a tearing event that interrupts the process of updating or programming the memory update flag can result in system errors.

In a first example, a full memory update may be completed correctly. Following completion of the memory update, the system may attempt to clear the memory update flag to indicate that the update is complete and that the memory used to store the backup copy can be deleted or overwritten. If the process of clearing the memory update flag is interrupted or torn (meaning that the flag value becomes unpredictable), when the system reboots, the system may determine that the memory update flag is still set indicating that the memory update process has not completed and has instead failed. This will result in the backup copy being restored so that the memory update process can be restarted. Then, if a subsequent tearing event occurs while mid-process in restoring the back-up data, when the system reboots for the second time and re-reads the memory update flag, if the flag appears cleared, that may indicate that there is no on-going memory update process and that the system is running normally. The system may make this determination even though there is now a combination of partially restored backup data and new updated information stored in the system memory. This mixture of old and new information can result in system faults or suboptimal system performance.

In another example, a system may successfully create a backup data copy as part of a memory update process. The system may then attempt to set the memory update flag to indicate that the backup copy has been created and the memory update process can proceed. If a tearing event occurs while programming the flag, upon reboot, if the flag appears to be cleared, the backup copy will be interpreted as being invalid. This will result in the memory update process restarting from the beginning. Upon starting a new memory update, the backup process may again be interrupted. If, upon reboot, the system may now determine that the memory update flag is set, the system would conclude that the backup copy needs to be restored even though, at this point, the backup copy is only partially complete. If the system attempts to restore the backup copy, the system main memory may be overwritten and corrupted with incomplete data.

Consequently, it is preferable that any such memory update flag be implemented as an "atomic" flag in which the flag is set in a reliable manner without the risk of a tearing event resulting in uncertain pseudo-random flag values. As the physical effect of a potential tearing cannot be avoided, the implementation must be able to detect and resolve an eventual tearing event. Consequently, at the system-level (e.g., when viewed from the perspective of a system processor), the proposed implementation of a flag including the detection and resolution methodology described herein is seen as being atomic. The present flag implementation is thus considered atomic even though, as described herein, a memory controller may execute a number of different and sequential operations to either set or clear the flag.

As such, in the present flag implementation, a weakly cleared or set flag, which may be read as a logic 1 or 0 in a pseudo-random manor, must reliably be detected as being weakly set (i.e., having a set value that is close to the memory cell's threshold value) and should then be capable of being accurately strengthened (i.e., by increasing or decreasing the memory cell's value away from the cell's threshold value). Similarly, a strongly cleared or set flag should not be altered to its opposite value during a strengthening process.

Therefore, as described herein, the present disclosure provides a system configured to execute a robust memory flag that may be utilized in conjunction with a memory update process (or any other system process requiring a flag value), wherein the flag allows the memory update process to recover even when a tearing event occurs while updating the value of the memory update flag. As described herein, the process does not require perfect knowledge of the value of the memory update flag. Instead, an alternate inspection or flag-reading process is used in which the value of the flag can be read reliably.

In some memory systems, when a memory cell has been weakly programmed or cleared to a particular value or condition (e.g., a voltage, current, or resistance value), the memory cell may have a value that is close to the threshold value that delineates a set or cleared state for the cell. In those cases, the memory system may "strengthen" that memory cell by re-programming the cell. This action attempts to strengthen the memory cell's value (in either a positive or negative direction) so that the memory cell is no longer close to the threshold value and at risk of being misread.

In memory systems that include memory cells that exhibit monotonic behavior, this strengthening process may typically involve moving the cell's value only in the desired direction away from the threshold value and not in the opposite direction towards the threshold value. This is a result of the memory cell's programming mechanism, which provides well-controlled current direction. Hence a strengthening operation will tend to not make a strongly set or cleared flag weaker (i.e., having a value closer to the cell's threshold value) although such strengthening might cause stress or disturbances which normally shall be avoided.

In some cases, however, memory system may include memory cells that exhibit non-monotonic programming operations. Such cells may include resistive RAMs that make use of the specific resistance of filaments contained within each memory cell. Programming such a cell requires changing the resistance of the filament as an indicator of the cell's value. But the filament resistance changes are generally not well controlled and as such, when programming the cell towards a particular state, the cell's value may temporarily fluctuate towards the opposite state. As such, when strengthening such non-monotonic memory cells, particular algorithms may be used that perform an initial determination of whether the memory cell's resistance is low or high enough to reliably indicate that the memory cell is cleared or has been set (e.g., the memory cell represents a logic 0 or 1). If so, the algorithm repeatedly programs the memory cell until the required minimum or maximum resistance is achieved. If such an algorithm cannot complete due to a tearing event, the logical value of the bit cell may be assumed to be unknown. Consequently, trying to strengthen the value of a memory cell which is already strongly set or cleared, may result in the cell having a weaker state if the strengthening algorithm is started but not completed.

Another issue that relates to the reading of memory cells can be the accuracy of the memory cell read operation. Because this process typically requires the conversion of an analog value (e.g., a difference between the charge or voltage measured on a memory cell's floating gate and a threshold value, a difference between the current flow measured through a memory cell and a threshold current value, or a difference between a resistance of a component of the memory cell and a threshold resistance value) errors in the original analog memory cell measurement read operations can occur. If the measured analog values are close to the threshold values that delineate the memory cell being designated as cleared or set, there is a risk that during the analog read operation and the resulting analog error could lead to the memory cell being read incorrectly.

Figure 4:
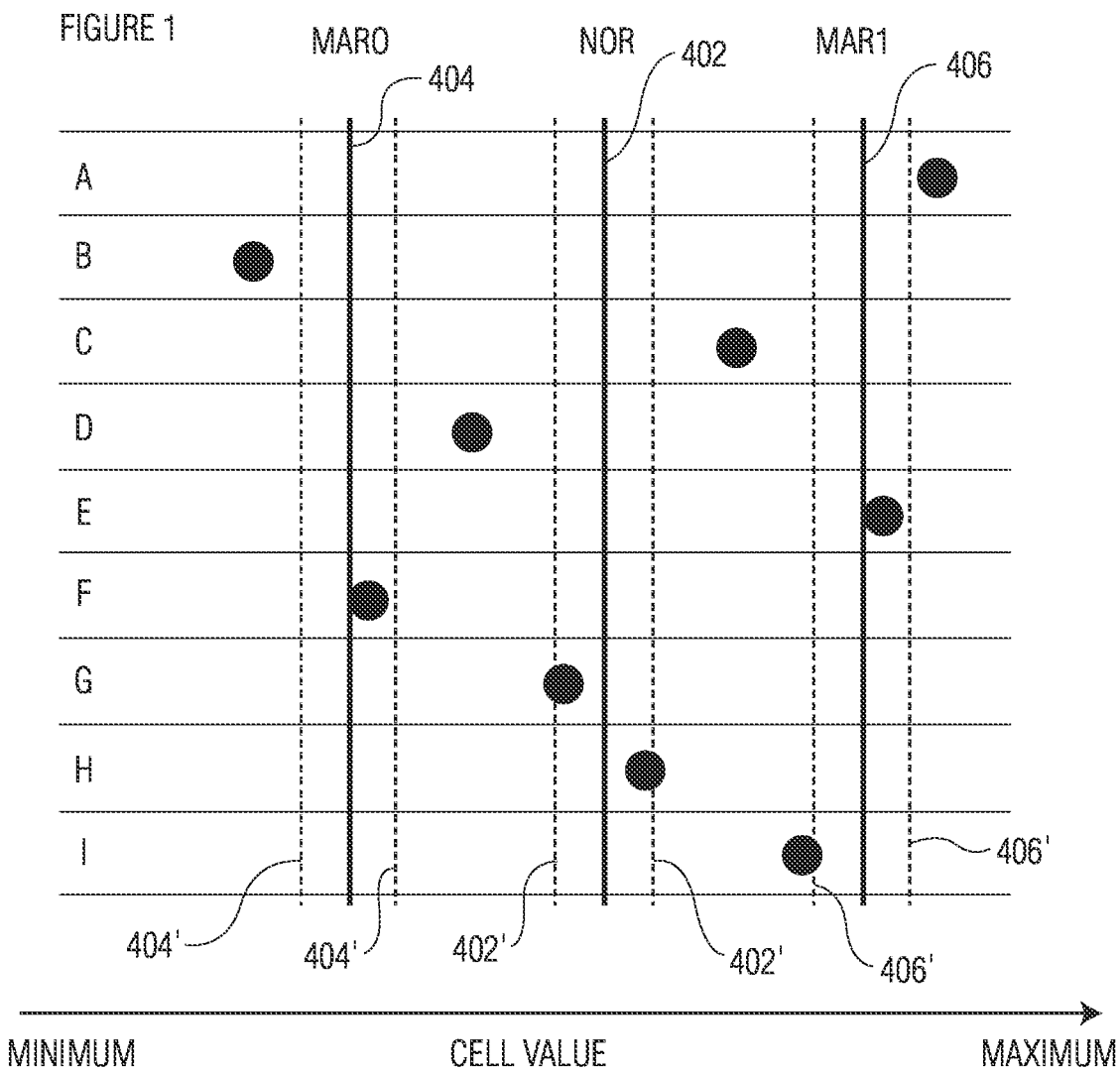
FIG. 4 is a chart depicting example analog values of a memory cell.

To illustrate these complexities, FIG. 4 is a chart illustrating example analog signal values or values (e.g., gate voltage, drain current, resistance) of a memory cell and how those signal values compare to the cell's signal value threshold. Specifically, FIG. 4 depicts several examples A-I. For each example, the horizontal axis represents the memory cell's analog value (e.g., gate voltage, drain current, or resistance) and the vertical line 402 the threshold value for the memory cell. If the cell's analog value, represented by the black circles in each example A-I, is less than the threshold 402, the cell is read as being cleared (e.g., has a value of '0'). If the analog value is greater than threshold 402, the cell is read as being set (e.g., has a value of '1').

As described above, analog measurement schemes often have some degree of uncertainty. Reflective of this, the dashed lines 402' running alongside threshold 402 indicate a range of values around threshold 402 that represent uncertainty boundaries. Accordingly, if a cell has a value that falls between the dashed lines 402' around threshold 402, depending upon conditions (e.g., ambient temperature, variations in the system supply voltage, ambient radiation effects, and/or random noise) at the time the cell value is read, the cell value could fall on either side of threshold 402.

To provide more reliable read values, additional margin values 404, 406 may be defined for the memory cells, where the margin values 404, 406 are set apart from threshold 402 by an amount greater than the error bars (dashed lines) around each value. Margin values 404, 406 are each associated with their own uncertainty boundaries designated by dashed lines 404' and 406', respectively.

If the memory cell's value falls below (to the left of) margin 404, for example, the system can determine with high confidence that the memory cell is cleared and can designate that memory cell a value of 0. Conversely, if the memory cell's value is above (to the right of) margin 406, for example, the system can determine with high confidence that the memory cell is set and can designate that memory cell a value of 1.

In order to compare the memory cell's value to either margin 404 or 406, the system is configured to perform a read operation on the memory cell to compare the value of the memory cell to one of the margin 404, 406 values. This process is referred to as performing margin checks on the value of a particular memory cell.

In a similar manner to threshold 402, there are uncertainties in reading the memory cell's value at either of margins 404, 406 and so FIG. 4 depicts similar dashed lines around each of the margin 404, 406 values as shown for threshold 402. As described above, the dashed lines 404', 406' represent error or uncertainty margins around each such margin 404, 406 value.

As a consequence of tearing that may occur when writing a value to the memory cell, the value of the memory cell may fall between margins 404, 406. This circumstance is illustrated in example cases C and D depicted in FIG. 4. In either example, the memory cell is weakly programmed as both cell values fall between margins 404, 406. Specifically, example C fails the margin 406 check as a logic value 0 is read in performing that margin check. Similarly, example D fails the margin 404 check as a logic value 1 is read in performing that margin check.

Typically, memory system can use the margin checks to identify memory cells that are weakly programmed and, based upon identifying such a memory cell may initiate strengthening of the memory cell's value. But in these approaches, problems can arise in memory cells having values that are within the uncertainty intervals (e.g., the dashed lines in FIG. 4) of margins 404 and 406. Cases E and F, for example, can both be reliably read in a normal memory cell read mode (e.g., via comparison against threshold 402), so a memory cell having those values may be considered stable and strongly cleared or set. Additionally, both example cases may possibly pass margin checks. However, because both of the values depicted in examples E and F fall within the uncertainty boundaries around margin 404 (example F) and margin 406 (example E), there is some chance that the measured values will fail one of the margin checks. As such, memory cells that are relatively strongly programmed and should be considered stable bits may be interpreted as being weakly programmed. Failing such a check would normally result in memory cell strengthening.

In contrast, examples G and H represent memory cell values that are weakly programmed and unreliable in a normal read (e.g., in a comparison against threshold 402) because the values fall within the uncertainty boundary around threshold 402. Consequently, examples G and H will reliably fail margin checks as the values do not fall either below (to the left of) margin 404 or above (to the right of) margin 406. Because examples G and H fall within the uncertainty boundary around threshold 402, a strengthening operation applied to the memory cells of those example may, depending on the actual values read, strengthen either of examples G and H in a random (and potentially incorrect) direction.

Referring to FIG. 4, example I is similar to example E in that the depicted memory cell value falls within the uncertainty range around margin 406. As such, depending upon the actual value of the memory cell that is read, example I could be determined to fail the margin 406 check. If example I does fail the margin 406 check, however, the cell is likely to be strengthened in a manner that pushes the memory cell value greater than (to the right of) margin 406.

The various examples depicted in FIG. 4 illustrate problems associated with the reading and strengthening of memory cells values. Specifically, it can be difficult to determine whether a particular cell should properly be strengthened (e.g., example C to the right, example D to the left, and examples G or H either to the left or right) or that strengthening should not occur (e.g., examples E, F, and I), even while margin checks may show the same results for memory cells that should and should not be strengthened (e.g., examples C and E might have the same results for margin checks should example E be measured below margin 406 due to being within the uncertainty boundary show, but only example C should be properly strengthened).

To compensate for the risks of tearing when a memory cell (e.g., a memory update flag) is programmed and the corresponding difficulties of strengthening approaches for partially-programmed (i.e., weakly set or cleared) memory cells, the present disclosure provides an approach for implementing an atomic flag within a memory system that implements a logical routine to represent the atomic flag and an improved memory cell strengthening approach to mitigate risk associated with tearing events while minimizing the risk that a strongly programmed memory cell is weakened or memory systems exhibiting non-monotonic programming behavior.

Such atomic flags as provided by the present disclosure may be used to implement tear-resistant memory updates on system-level. The present atomic flag approach could also be used to implement a security flag to control access permissions or as an indicator of a completed transaction (e.g., a bank transfer, contract execution, or product purchase).

In general, the present solution combines a logical approach to detect a potential tearing event without use of margin modes. In an embodiment, the approach utilizes two memory cells (i.e., two bits) to represent the atomic flag, though other embodiments will involve three or more memory cells. Upon detecting a tearing event, the approach implements an algorithm to identify the weakest bit within the atomic flag. A detected tearing event will then get resolved by updating the weakest bit in the atomic flag. The approach, as described herein, minimizes the risk of strengthening an already strong bit to reduce the likelihood that tearing can result in an inconsistent flag value.

In general, a memory cell is capable of representing two logic states (e.g., '0' and '1' or 'cleared' and 'set'). When the cell is being programmed from the 0 or cleared state or condition to the 1 or set state or condition, the memory cell value will transition through the uncertainty boundary around the threshold value for the memory cell (e.g., the uncertainty boundary around threshold 402 of FIG. 4). At that level, the cell is assigned a value of 'X' that represents an uncertain state between the two binary states. Accordingly, when setting the atomic flag, the flag will transition through the following states—0→X→1. Conversely, when clearing the atomic flag, the memory cell value will transition from state 1 to state 0 in a similar manner—1→X→0. If the setting or clearing process is interrupted (e.g., by a tearing event), the flag may get stuck in the X state, indicating that the value of the flag is unknown. It is important that the system is able to detect when a flag is in the X state. As the X state may only occur in case of tearing, the determination of whether the memory cell having the X state is set or cleared state is somewhat arbitrary, as any such choice would be the same as if the tearing event had occurred a bit earlier or later in the flag update process. In the event that a memory cell is in the X state, it can be desirable that the present system is either repeatably readable with the same result or that the cell is made reliable by a strengthening operation before using the flag value for any further decision. Additionally, it can be desirable that the system operations do not cause a memory cell that was previously properly set or cleared to become unstable (i.e., having an X state) due to cell strengthening operations, which themselves could be torn.

Memory cell strengthening operations can behave non-monotonically. Either by the nature of the physical bit cell behavior or by the necessary update algorithms, a memory cell that is being strengthened might temporarily enter a weaker or opposite state before finally reaching the desired strengthened state. As such, if a strengthening process gets torn, the resulting bit strength might be weaker instead of the bit being properly strengthened.

Figure 5:
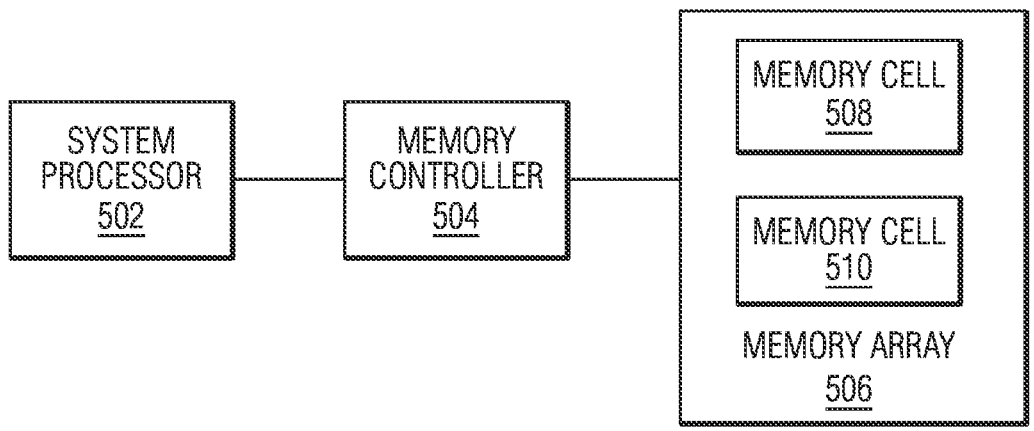
FIG. 5 is a block diagram showing functional components of an atomic flag in accordance with the present disclosure.

In the present system, an atomic flag is implemented in which the flag uses two memory bits (i.e., two memory cells) that, together, represent the value of the atomic flag. FIG. 5 is a block diagram showing functional components of the present atomic flag implementation. System processor 502 (e.g., CPU 102 of FIG. 1 or processor 202 of FIG. 2) accesses and modifies stored information through memory controller 504. Memory controller 504 is configured to access memory array 506 (e.g., one of ROM 104, RAM 106, flash memory 108 of FIG. 1 or memory array 208 of FIG. 2) to retrieve data therefrom or write data thereto. Specifically, memory controller 504 is configured to access values stored in a number of memory cells contained within memory array 506. Each memory cell in memory array 506 may be configured in accordance with the individual memory cells memory blocks 216 or memory blocks 218 of FIG. 2 or, specifically, the individual memory cells 311-1, . . . , 311-N of FIG. 3. With reference to FIG. 5, only two memory cells 508 and 510 are shown, even though memory array 506 may contain many more individual memory cells. The two memory cells 508 and 510 may be utilized by memory controller 504 and system processor 502 to implement the atomic flag of the present disclosure.

Memory cells 508 and 510 operate together as a single 2-bit memory flag. Specifically, memory cell 508 operates as the first bit in the flag and memory cell 510 operates as the second bit. As described herein, by sequentially setting or clearing the two bits of the memory flag (i.e., memory cell 508 and memory cell 510) the flag can more easily recover from a tearing event and better detect potentially contradictory flag settings.

Because the flag contains two bits, the flag may have 4 different states (also referred to herein as conditions). In the present embodiment, the first value or condition, 0-0 (e.g., when both memory cells 508 and 510 have a value of '0') represents an invalid or uninitialized flag condition. The second value or condition 0-1 (e.g., when memory cell 508 has a value of 0 and memory cell 510 has a value of 1) represents that the flag is in a cleared state. The third value or condition 1-0 (e.g., when memory cell 508 has a value of 1 and memory cell 510 has a value of 0) represents that the flag is set. In this manner the set condition is an opposite condition from the cleared condition. Finally, the fourth state or condition 1-1 (e.g., when both memory cells 508 and 510 have a value of 1) represents that the flag is in an unknown or X state.

Figure 6:
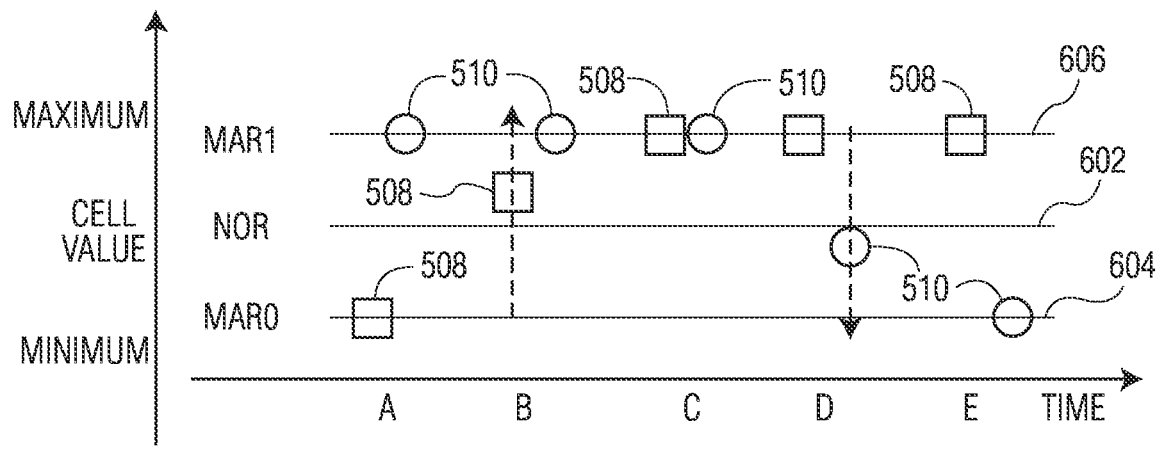
FIG. 6 is a sequence diagram illustrating steps in an algorithm implemented by a memory controller to set an atomic flag.

During operation, system processor 502 may detect a trigger event (e.g., initiating of a memory update operation) causing system processor 502 to instruct memory controller 504 to set the flag, memory controller 504 is configured to set memory cell 508 and memory cell 510 sequentially so that the first memory cell 508 is fully programmed (i.e., set to a condition associated with an analog value—such as a voltage, current, or resistance—associated with the desired set or cleared state) before memory controller 504 modifies the second memory cell 510. FIG. 6 is a sequence diagram illustrating the algorithm implemented by memory controller 504 to set the flag.

Referring to FIG. 6, the horizontal axis represents time while the vertical axis represents memory cell value (e.g., floating gate voltage, drain current, or resistance), which ranges from a minimum value to a maximum value. On the vertical axis, horizontal line 602 represents the memory cell threshold value (e.g., threshold 402 of FIG. 4). Horizontal line 604 represents the lower margin threshold (e.g., margin 404 of FIG. 4) and horizontal line 606 represents the higher margin threshold (e.g., margin 406 of FIG. 4). On the time axis, five distinct time periods A through E represent distinct steps in the flag setting process. The square icons on FIG. 6 represent the value of the first memory cell 508 in the present flag, while the circular icons represent the value of the second memory cell 510 in the present flag.

In an initial step (e.g., time period 'A' on FIG. 6), the flag is in its cleared state of 0-1 as indicated by the first memory cell (square) having a value that falls below threshold 602 and the second memory square (circle) having a value that falls above threshold 602.

To begin setting the flag, as illustrated by time period 'B', memory controller 504 causes the value of the first memory cell (square) to increase (e.g., by supply a charge to that memory cell) so that the value of that memory cell transitions to a value greater than threshold 602 indicating that the memory cell has been set. While the value of the first memory cell is transitioning past threshold 602, the first memory cell has a value of X. Accordingly, at time period B in the flag setting process the flag has a value of X-1.

At time period 'C', the first flag is now set and both bits of the flag have values of 1 (indicating by the square of the first memory cell and the circle of the second memory cell having values greater than threshold 602). Accordingly, at time period C in the flag setting process the flag has a value of 1-1.

At time period D, with the first memory cell properly set to a value of 1, memory controller 504 initiates the process of programming the second memory cell 510. As such, memory controller 504 causes the value of the second memory cell (circle) to decrease (e.g., by discharging the charge stored on that memory cell's floating gate) so that the value of that memory cell transitions to a value lower than threshold 602 indicating that the memory cell has been cleared. While the value of the second memory cell is transitioning below threshold 602, the second memory cell has a value of X. Accordingly, at time period D in the flag setting process the flag has a value of 1-X.

Finally, at time period 'E', the second memory cell is now cleared and the two bits of the flag have values of 1-0 (indicated by the square of the first memory cell having a value greater than threshold 602 and the circle of the second memory cell having a value less than threshold 602). Accordingly, at time period E the flag is set and has a value of 1-0, which corresponds to the flag's set state.

This process of setting the present 2-bit atomic flag can therefore be summarized by the following state sequence with reference to the time period delineated in FIG. 6: 0-1 (time period A)→X-1 (time period B)→1-1 (time period C)→1-X (time period D)→1-0 (time period E).

Figure 7:
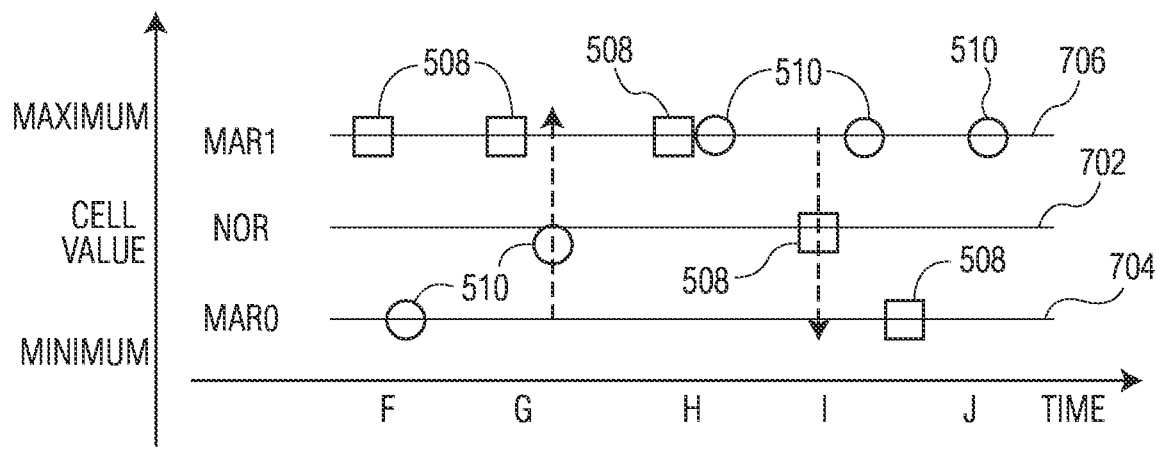
FIG. 7 is a sequence diagram illustrating steps in an algorithm implemented by a memory controller to clear an atomic flag.

Conversely, when system processor 502 instructs memory controller 504 to clear the atomic flag, memory controller 504 is similarly configured to set memory cell 508 and memory cell 510 sequentially in the opposite direction of the setting process. When clearing the flag, this is implemented by the memory controller 504 first programing the second memory cell 510. After programming the second memory cell 510, memory controller then programs the first memory cell 508 in the flag. FIG. 7 is a sequence diagram illustrating the algorithm implemented by memory controller 504 to clear the flag.

Referring to FIG. 7, the horizontal axis represents time while the vertical axis represents memory cell value (e.g., voltage, current, or resistance), which ranges from a minimum value to a maximum value. On the vertical axis, horizontal line 702 represents the memory cell threshold value (e.g., threshold 402 of FIG. 4. Horizontal line 704 represents the lower margin threshold (e.g., margin 404 of FIG. 4). Horizontal line 706 represents the higher margin threshold (e.g., margin 406 of FIG. 4). On the time axis, five distinct time periods F through J represent distinct steps in the flag clearing process. The square icons on FIG. 7 represent the value of the first memory cell 508 in the flag, while the circular icons represent the value of the second memory cell 510 in the flag.

In an initial step (e.g., time period 'F' on FIG. 7), the flag is in its set state of 1-0 as indicated by the first memory cell (square) having a value that falls above threshold 702 and the second memory square (circle) having a value that falls below threshold 702.

To begin clearing the flag, as illustrated by time period 'G', memory controller 504 programs the second memory cell by causing the value of the second memory cell (circle) to increase (e.g., by supplying a charge voltage to that memory cell or modifying a resistance of the memory cell) so that the value of that memory cell transitions to a value greater than threshold 702 indicating that the second memory cell has been set. While the value of the second memory cell is transitioning past threshold 702, the second memory cell has a value of X. Accordingly, at time period B in the flag setting process the flag has a value of 1-X.

At time period 'H', the second memory cell is now set and both bits of the flag have values of 1 (indicating by the square of the first memory cell and the circle of the second memory cell having values greater than threshold 702). Accordingly, at time period H in the flag setting process the flag has a value of 1-1.

At time period I, with the second memory cell properly set to a value of 1, memory controller 504 initiates the process of clearing the first memory cell 510. As such, memory controller 504 causes the value of the second memory cell (square) to decrease (e.g., by discharging the voltage stored on that memory cell or reducing a resistance of the memory cell) so that the value of that memory cell transitions to a value lower than threshold 702 indicating that the first memory cell has been cleared. While the value of the first memory cell is transitioning below threshold 702, the first memory cell has a value of X. Accordingly, at time period I in the flag setting process the flag has a value of X-1.

Finally, at time period T, the first memory cell is now cleared and the two bits of the flag have values of 0-1 (indicating by the square of the first memory cell having a value less than threshold 702 and the circle of the second memory cell having a value greater than threshold 702). Accordingly, at time period J the flag is set and has a value of 1-0, which corresponds with the flags cleared state.

The process of setting the present 2-bit atomic flag can therefore be summarized by the following state sequence with reference to the time period delineated in FIG. 6: 1-0 (time period F)→1-X (time period G)→1-1 (time period H)→X-1 (time period I)→0-1 (time period J).

As described above and illustrated in FIGS. 6 and 7, the memory controller is configured to program the atomic flag for both setting and clearing the flag by first clearing or setting a single memory cell or bit (e.g., when setting the flag, in the initial step the first bit is set to a value of '1' and when clearing the flag in the initial step the second bit is set to a value of '1') of the flag's two memory bits, followed by then clearing or setting the other bit in the atomic flag. Note that in other embodiments, rather than setting a bit as an initial step of either clearing or setting the atomic flag, an alternative implementation could use the order clear before set without any fundamental difference. In that case, the flag state of 0-0 would be considered invalid/torn.

Because the 2-bit values of the atomic flag are programmed sequentially (when both clearing or setting the atomic flag), in a tearing event, only a single one of the atomic flag's bits will be in an uncertain or X state. As such, the unknown states of the atomic flag bits may be either X-1 or 1-X, but not X-X.

When reading the value of the atomic flag, the X state of a particular memory may be read as either a 0 or 1 value, depending upon whether the memory cell's value is read as being above or below the cell's threshold value. Accordingly, if memory controller 504 reads the X-1 flag as being set to a state of 0-1, memory controller 504 will interpret the atomic flag as being in its cleared 0-1 state. This is correct, as the tearing happened during the first step of a set operation or during the second step of a clear operation. In either case, the flag is properly categorized as being cleared. If, however, memory controller 504 reads the X-1 flag as being set to a state of 1-1, memory controller 504 will determine that a tearing event has occurred because an atomic flag state of 1-1 indicates that the atomic flag is in an unknown X state and should be resolved.

Equivalently, if the flag is in a 1-X condition and memory controller 504 reads such a flag as being in a 1-0 state, the memory controller 504 may determine that the atomic flag is in a set state. This is correct, as any tearing event that put the atomic flag in the 1-X state would have occurred during the second step of a flag set operation or during the first step of a clear operation. In either case, the flag would be properly read as being set. If, however, memory controller 504 reads the 1-X flag as being set to a state of 1-1, memory controller 504 will determine that a tearing event has occurred because an atomic flag state of 1-1 indicates that the atomic flag is in an unknown X state and should be resolved.

If memory controller 504 should read either an X-1 or 1-X flag state as being a 1-1 state, the memory controller 504 determines that a tearing event has occurred and must be resolved. By executing a normal read operation (e.g., comparing the memory cell's values against threshold 602 or 702) the memory controller 504 cannot determine which of the two memory bits is strongly set and which is weakly set. Hence, upon detecting a 1-1 atomic flag condition, the memory controller 504 may execute a searching algorithm to determine which of the two memory bits in the atomic flag has the weaker set value of the two (indicating that the tearing event occurred during the setting of that memory cell).

If both of the bits in the atomic flag are read as 1 (i.e., a 1-1 condition), memory controller 504 may determine that the flag is in an unknown state and may affirmatively reset the flag by setting either one of the bits (e.g., memory cell 508 or memory cell 510) to a cleared condition. As described before, the choice can be arbitrary in view of the actual flag value, as the flag could have been torn earlier or later in the flag programming process. But the decision should not strengthen a strong bit, if the other bit is a weaker bit, as otherwise a subsequent tearing might result in both bits being weak, potentially leading to an unresolvable X-X condition. By clearing the weaker bit, the resulting flag will then either be in a cleared or set state. If this process suffers from a tearing event, the other bit of the flag (i.e., the unchanged bit) will continue to be strongly set to a value of 1. Consequently, this reset process may not result in the atomic flag entering an X-X condition.

In view of the above, memory controller 504 may be configured to determine which of the bits in the atomic flag is the weaker of the two in the 1-1 condition so that memory controller 504 can select that weaker-set bit for clearing (i.e., programming to a value of 1). Consequently, memory controller 504 may be configured to implement a margin check process to make the determination as to which of the two bits is more strongly set and which bit is more weakly set. Although memory controller 504 may be implemented with various margin modes to identify the weaker bit, in an embodiment memory controller 504 is configured to implement a margin search method to identify the weaker memory bit in the flag.

Figure 8:
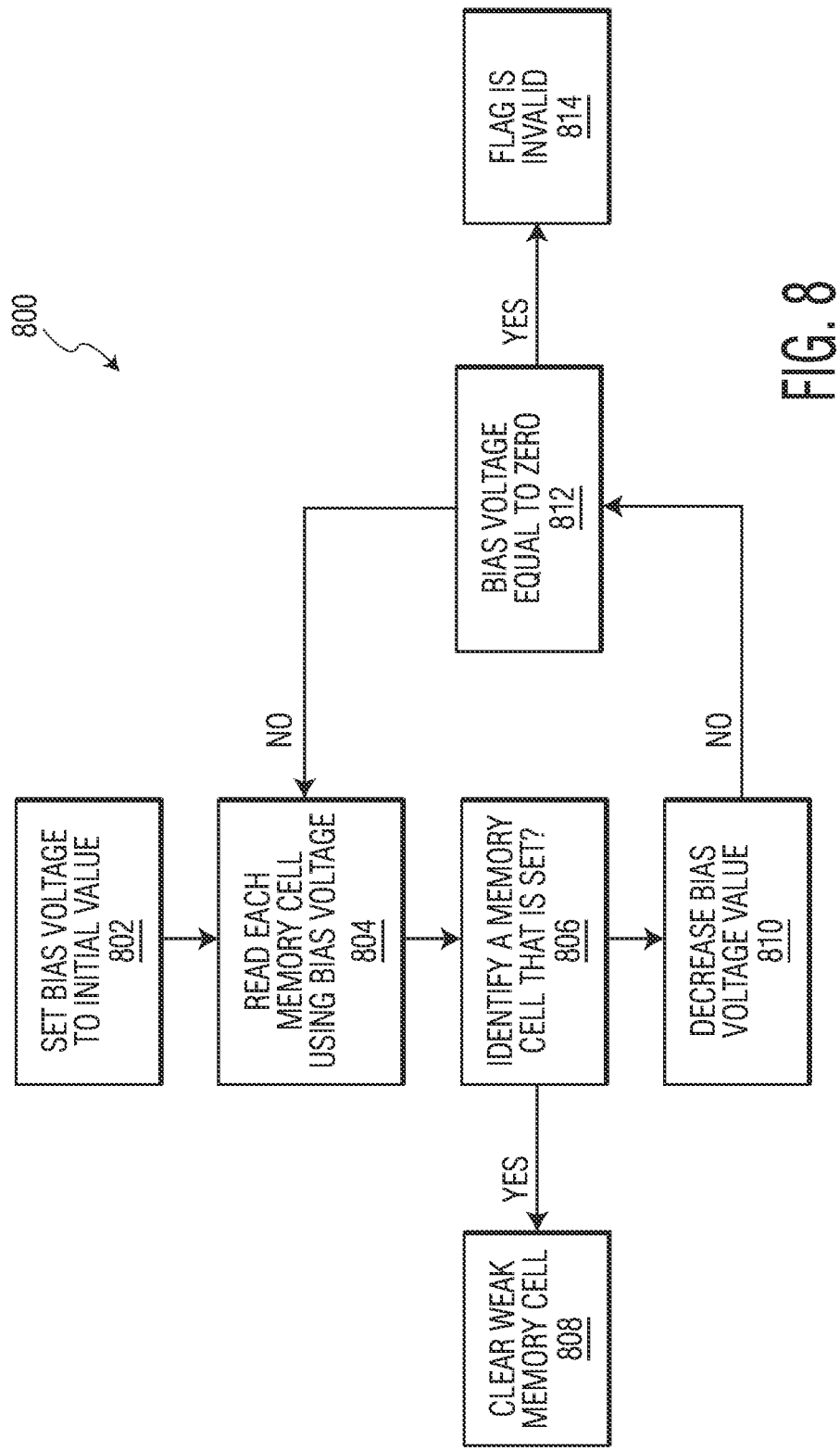
FIG. 8 is a flowchart depicting a method for identifying the weaker of two bits in an atomic flag.
Figures 9, 10, 11:
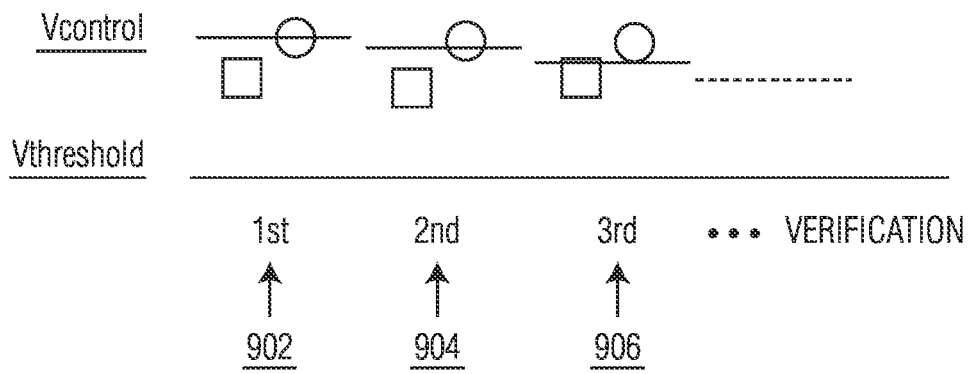
FIG. 9 is a chart depicting different steps in an example implementation of the method of FIG. 8.
FIG. 10 is a chart in which each row depicts the values of the various bits of a 3-bit atomic flag as the flag is programmed from a cleared state to a set state.
FIG. 11 is a chart in which each row depicts the values of the various bits of a 3-bit atomic flag as the flag is programmed from a set state to a cleared state.

FIG. 8 is a flowchart depicting method 800 for identifying which of the first memory cell and the second memory cell is in the weaker set state (i.e., which memory cell has a signal value that is closer to the memory cell's threshold value) in the atomic flag. FIG. 9 is a corresponding chart depicting different steps in an example implementation of method 800.

In an initial step 802 of the margin search method 800, a gate bias voltage is determined based upon an initial margin value. This value, when applied to the gate terminal of the memory cell, raises the threshold voltage for the memory to a value greater than the default threshold (e.g., thresholds 602, 702) of the memory cells storing the two bits of the atomic flag and may equivalent to a higher margin value (e.g., margin 606 or margin 702). As such, the gate bias voltage applied in step 802 may be referred to as a margin read bias voltage.

It should be noted that other types of memory cells may implement a margin read function by applying other types of signals to the memory to perform a margin read. Such margin read signals may include particular voltages or currents that are applied to the memory cell to perform the margin read function. In those types of memory cells, such a signal may be referred to as the margin read signal, which may be adjusted to perform memory cell read operations at different margin values. For example, in some memory cells a margin read signal may comprise a particular voltage or current that is applied to a margin read terminal of the memory cell in order to read a value out of the memory at that particular margin level. The cell will be read as being in different states if the value (e.g., voltage, current, or resistance) of the memory cell falls above or below the value of the margin read signal. Consequently, as described in conjunction with the method of FIG. 8 and remainder of the description, references to gate bias voltages should be understood to be equivalent to other types of margin read signals. Additionally, references herein to a memory cell's gate terminal, should be understood to be equivalent to any type of memory cell's margin read terminal, which may include transistor gate terminals or any other memory cell input terminal suited for receiving a margin read signal for the memory cell. It should also be apparent that in various electronic systems that voltages and current signals are sometimes largely equivalent in that application of a signal comprising a voltage may require the generation of a corresponding current and application of a signal comprising a current may require the generation of a corresponding voltage.

After setting the bias voltage to achieve that initial margin value, in step 804 the bias voltage is applied to the gate terminals of the memory cells being read and the memory controller 504 reads the values of each memory cell in the flag.

In step 806, memory controller 504 then determines whether either memory cell is read as being set or having a value of '1'. Typically, in step 806 memory controller 504 will only detect that a single one of the memory cells is read as having a value of '1'. In that case, the other memory cell (i.e., the memory cell that is read as having a value of '0') is considered the weaker cell as its stored voltage does not exceed the threshold established by the margin read bias voltage. Consequently, in step 808 memory controller 504 is configured to reset or clear the other memory cell that was determined to have a value of '0' in step 806 (i.e., a value below the margin value). If, however, in step 806 memory controller 504 determines that each memory cell reads as having a value of '1' or is set, memory controller 504 is configured to select (e.g., at random or according to a predetermined algorithm) one of the two memory cells to be reset. This is appropriate, because if both cells are equally or similarly strong, both cells are not weakly set. Consequently, clearing either memory cell should not result in the flag having an X-X condition, even if the process of clearing or resetting the selected memory cell is torn.

If, however, in step 806 memory controller 504 determines that neither of the memory cells read as being set or having value of '1', the method continues to step 810 in which the bias voltage is reduced by some amount. This situation is illustrated in FIG. 9. As shown in FIG. 9, in the initial state 902, the bias voltage is set to a value that results in both memory cells of the flag to fall just below the margin threshold value due to read accuracy limitations. Then, according to step 810, the value of the bias voltage is decreased (e.g., as in state 904 of FIG. 9) to again determine whether each memory cells of the flag are read as exceeding the reduced margin value (e.g., having a value of 1). This process may repeat, with the bias voltage being repeatedly reduced until one or both of the memory cells of the atomic flag are read as being set with a value of 1 or having a value that exceeds the margin threshold (e.g., state 906 of FIG. 9). The exact amount of the margin reduction depends mostly on the accuracy of the design of the read circuitry (e.g., memory controller 504). Additionally, typical memory read circuitry implementations require some trade-off between performance and memory read accuracy—smaller steps tend to detect the weaker bit more accurately but require more time to complete the read operation, while larger steps speed up the read operation but result in lower accuracy. The linear search method described herein, does not limit the scope; any other search algorithm (e.g. binary) can be chosen as well.

Returning to FIG. 8, in step 812 the memory controller 504 determines whether the bias voltage has been reduced to zero, in which case the memory cells of the atomic flag would be read per standard conditions. If so, both cells will be read as 0-0 and the method moves to step 814 in which the memory controller 504 determines that the flag is invalid. According to the described method, this condition will never be reached, as the implementation will always guarantee that at least one of the two cells is strongly set. Hence, such a case is an extra-ordinary error condition and any suitable resolution may be implemented included performing additional system checks, generating alerts, flags, or warning messages that may be communicated to system processor 502. System processor 502 can then take any suitable action including terminating the process that relies on the flag or generating an alert to a system user notifying the user of the error.

If, however, the bias voltage is not equal to zero, the method continues to step 804 and continues executing until the weaker memory cell is identified or the method exits or ends for other reasons.

Although the margin search process depicted in FIG. 8 and described herein contemplates approaches for measuring cell values by measuring or determining voltages or charge stored in memory cells based upon the application of a bias voltage, it should be understood that the margin search algorithm could be utilized in conjunction with other types of memory cells in which other signals (e.g., current flowing through the memory cells, resistance values, and the like) are utilized to encode information into the memory cell. As such, the margin search approach may be utilized in any memory system application in which memory cells are configured to generate output signals that are indicative of the cell's value where the output signal is compared to one or more threshold signal values to determine whether the cell is cleared, set, or has another value.

During execution of the margin search process described above and depicted in FIGS. 8 and 9, tearing events could occur during step 808 in which the weaker memory cell is cleared. If that clearing process is interrupted, the resulting value of that memory cell could be 0, 1, or X. If the memory cell is set to a strong 0 value, the atomic flag will become a solid set or cleared (depending which bit was cleared). If, however the memory cell is set to a value of 1, the atomic flag is set to a 1-1 condition which represents the atomic flag being unknown. In that case, the method of FIG. 8 will be re-executed to resolve the atomic flag status.

The margin read method depicted in FIG. 8 can provide that there will be a maximum of a single memory cell of the atomic flag in a weak or X condition. Even if one of the two memory cell of the flag is only marginally cleared, that memory cell may be read as a value of '0' but may be close the memory cell's threshold level, that condition will not break the algorithm of FIG. 8 because the other memory bit of the atomic flag is in a strong set condition with a value of 1. In that case, the margin read method of FIG. 8 will perform a margin search on both memory cells to identify the weaker cell or bit. The weaker bit will then be cleared without changing the ultimate value of the atomic flag.

In typical implementations, it may be preferable that flags controlling system update status have a default condition. For example, when the flag is used to indicate whether a memory update process has completed, the memory update may follow the following sequence of steps—first, create the backup file, second, set a "backup-valid" flag, third, update memory, and fourth, clear the "backup-valid" flag. In such an implementation, the default condition of the "back-up" valid flag may be "cleared" indicating that the back-up is not valid. This would reflect a normal condition before an update has started or after an update has completed. Such a flag may have a value of X (i.e., unknown) if a tearing event occurs when the flag is being programmed. Using the present 2-bit atomic flag, if both memory bits of the flag are set to equally strong values (e.g., as determined by the margin search method 800), the flag can be reset or cleared without consequence. As such, the determination that the flag is set or cleared can be made arbitrarily. This can advantageously be used to decide the default condition for the flag.

The implementation of the 2-bit atomic flag described above provides a robust flag that is resistant to read errors due to tearing. There may be some circumstances, however, where the flag may not be robust to multiple tearing events that happen sequentially at very specific time periods. For example, if the very last update of the flag-clearing process is torn, this tearing event may result in the flag being set to a value of 0-1, where the memory cell storing the 0 value is very weakly cleared. At the next reading, the weakly-cleared bit may accidentally be read as a value of 1, in which case the 1-1 pattern will indicate that a tearing event occurred. Per the process described above (and illustrated in FIG. 8), the weakly-cleared cell (that is incorrectly read as a 1) will be identified and again cleared per the margin read algorithm. If, however, another tearing event occurs when clearing that memory cell, the cell could incorrectly be programmed to a set state assuming non-monotonic programming behavior. In that case, the flag will be read as having a value of 1-1. In that case, because the memory cell is now strongly set, the outcome of the margin read algorithm of FIG. 8 could now identify the other bit as being weaker and clear it consequently. Finally, the bit might have flipped, for example, from a (weak 0)-1 to a 1-0 condition.

Such a case may be a more theoretical corner case as a result of the fact, that a non-monotonic function can never be made strictly monotonic in a mathematical sense. Although this situation is unlikely as it relies on multiple sequential and perfectly-timed tearing events in conjunction with non-monotonicity, embodiments of the present memory flag may be implemented using more than 2-bits to reduce the likelihood of such an event occurring. The number of "proper" tearing events which can let the flag toggle to its inverse value scales with the number of used sequential updates of physical bits.

For example, in various embodiments, the present atomic flag may be implemented using three or more bits. For example, an atomic flag may be implemented in which the flag uses three memory bits (i.e., three memory cells) that, together, represent the value of the atomic flag. Such a flag may be implemented by the system of FIG. 5, in which the flag is represented by three different memory cells of memory array 506. In that case, the three memory cells of memory array 506 may be utilized by memory controller 504 and system processor 502 to implement a 3-bit atomic flag in accordance with the present disclosure.

In this embodiment, memory controller 504 works in conjunction with memory cells of memory array 506 to implement the 3-bit memory flag. When the 3-bit flag has a state of 1-0-1 the flag may be considered to have a first state or condition (i.e., the flag is cleared). However, when all bits of the flag are flipped so that the flag has a value of 0-1-0, the flag may be considered to have a second state or condition (i.e., the flag is set). In this manner the set condition is an opposite condition from the cleared condition. In this 3-bit configuration the left-hand bit and the right-hand bit are utilized for tearing protection and detection, while the center bit stores the actual value of the atomic flag.

During operation, when system processor 502 instructs memory controller 504 to program the flag, memory controller 504 is configured to program each memory cell or bit of the 3-bit atomic flag sequentially so that the first memory cell of the flag is fully programmed (i.e., set to a desired memory cell value) before memory controller 504 modifies the second memory cell, and so on.

As such, when setting the 3-bit atomic flag, the memory controller 504 programs the three memory cells that make up the flag transition to particular values in a first direction and sequentially as follows. The memory cells transition from the initial cleared state to the set state as follows: 1-0-1 (i.e., the cleared state)→0-0-1 (first left-hand memory cell has been programmed)→0-1-1 (second center memory cell has been programmed)→0-1-0 (third right-hand memory cell has been programmed to put the flag into set state).

Conversely, when clearing the 3-bit atomic flag, the memory controller 504 programs the three memory cells that make up the flag transition to particular values in a second direction (opposite the first direction, above) and sequentially as follows. 0-1-0 (i.e., the initial set state)→0-1-1 (first right-hand memory cell has been programmed)→0-0-1 (second center memory cell has been programmed)→1-0-1 (third left-hand memory cell has been programmed to put the flag into cleared state).

During the setting or clearing operations, each individual bit of the 3-bit flag transitions for an initial state (e.g., set or cleared) to the opposite state through an intermediary unknown or X state. If a tearing event occurs while setting one of the bits of the 3-bit flag such that one of the bits would be read as an unknown or X state, the flag value protection provided by the two side bits allows for a determination of the value of the flag even when one of the bits is in an X state.

To illustrate, FIG. 10 is a chart in which each row depicts the values of the various bits of the 3-bit atomic flag as the flag is programmed from a cleared state to a set state. In FIG. 10, the first column represents that the values of the first left-hand (L) memory bit, the second column represents the values of the center or flag (F) bit, the third column represents the values of the right-hand (R) memory bit. The fourth column indicates the flag value should the flag be read with the 3-bits set according to the values in that particular row.

In a first step of the 3-bit flag setting process designated by row 1002, the 3-bits of the flag have the values 1-0-1 corresponding to the cleared state of the flag.

In a second step of the process designated by row 1004, the first (e.g., left hand) bit of the flag is being cleared. As the value of that bit transitions from its set state (value 1) to its cleared state (value 0), the bit transitions through an intermediary or unknown X state. If tearing occurs at this time, the three bits of the atomic flag will have the values X-0-1. When reading the value of the flag after such a tearing event, the memory controller (e.g., memory controller 504) is programmed to determine that the atomic flag is cleared and has a value of 0. Specifically, when reading the 3 bits of the flag, the left bit that was in the process of being cleared might still be read as a logic 1, which results in the flag having a value of 1-0-1, which is not distinguishable from the flag's initial state. In this case tearing is not detected, but the flag value is still valid, as the center memory bit is correct. In contrast, if the left bit is read as a logic 0, the flag is read as having a value of 0-0-1 and the memory controller can detect that a tearing event has occurred. The memory controller can make this determination because the left and right bits do not show the same logic value. As the tearing happened on the left bit, the flag is still valid, but further steps are needed to distinguish the case from another case which results in the same read-out and described further down related to row 1008.

In the third step of the process designated by row 1006, the first bit of the atomic flag has been successfully cleared. At this point, the bits of the flag have the values 0-0-1. Here, although all bits have a well-defined or strong logical state, the atomic flag has not been programmed to either its cleared or set value.

In the fourth step of the process designated by row 1008, the second (center) bit of the flag is being set. As the value of that bit transitions from its cleared state (value 0) to its set state (value 1), the bit transitions through an intermediary or unknown X state. If tearing occurs at this time, the three bits of the atomic flag will have the values 0-X-1 which might be read as 0-0-1 or 0-1-1. When reading the value of the flag after such a tearing event, the memory controller (e.g., memory controller 504) can determine that the atomic flag is either cleared or set, i.e. has a value of 0 or 1—the selection at this point is arbitrary, as the tearing happened during the flag update and as described for the initial example using 2 bits, a torn flag update can always be decided in either way. In case of tearing, the importance is not the actual flag value but to ensure the decision stays stable after resolving the torn situation.

In the fifth step of the process designated by row 1010, the second bit of the atomic flag has been successfully set. At this point the bits of the flag have the values 0-1-1. Here, although no tearing has occurred (i.e., all bits were successfully programmed and read), the atomic flag has not been programmed to either its cleared or set value. Even so, when the flag has the value of 0-1-1, the memory controller can determine that the flag should be considered set—the center bit has a value of 1 and that state can only exist during flag set process when either the center bit (i.e., the bit controlling the flag's value) or the third bit (see below) has not successfully been programmed. Also in this case, before making use of this decision, the 3-bit flag is resolved to make the flag stable and consistent, as described herein.

In a sixth step of the process designated by row 1012, the third (right hand) bit of the flag is being cleared. As the value of that bit transitions from its set state (value 1) to its cleared state (value 0), the bit transitions through an intermediary or unknown X state. If tearing occurs at this time, the three bits of the atomic flag will have the values 0-1-X. When reading the value of the flag after such a tearing event, the memory controller (e.g., memory controller 504) might read the 3-bit flag has having the value 0-1-1 (in which case the memory controller can determine that a tearing event has occurred) or the memory controller may read the flag as having the value 0-1-0, in which case the memory controller may not detect the tearing event and may determine that the 3-bit flag has been set. If the tearing event is detected, the resolution strategy can determine that the flag is set as the center bit is reliable and the memory controller may affirmatively clear the third bit. If tearing is missed, the flag will simply be interpreted as being set without any further action being needed. Even though the right bit might be undetected weak, the flag value will not change. The situation either remains undetected (in future reading events) or if suddenly the weak bit gets detected, the resolution will always be able to detect the weakness in the right bit, not in the center bit which reflects the flag value.

In the seventh and final step of the process designated by row 1014, the third bit of the atomic flag has been successfully set. At this point the bits of the flag has the values 0-1-0. Here, the atomic flag has been properly programmed into its set state and has a value of 1.

The memory controller may be programmed or configured so that after the atomic flag has been set, the memory controller avoids or prevents the set 3-bit atomic flag from being set a second time. This constraint, when implemented by the memory controller, can prevent errors resulting from the last bit being programmed in the flag setting operation being subject to a tearing event. In that event, the flag will have a value of 0-1-X, where the last bit may be read as a value of 0. If that 3-bit flag were to be set a second time, the first step in the setting process involves clearing the first bit. If that clearing operation is torn, the flag may have a resulting value of X-1-X, which is a flag condition that is invalid and may be irreparable. To avoid this condition, therefore, the memory controller may be programmed to inhibit the setting of a set flag.

FIG. 11 is a chart in which each row depicts the values of the various bits of the 3-bit atomic flag as the flag is programmed from a set state to a cleared state. In FIG. 11, the first column represents that the values of the first left-hand (L) memory bit, the second column represents the values of the center or flag (F) bit, the third column represents the values of the right-hand (R) memory bit. The fourth column indicates the flag value should the flag be read with the 3-bits set according to the values in that particular row.

In a first step of the clearing process designated by row 1102, the 3-bits of the flag have the values 0-1-0 corresponding to the set state of the flag.

In a second step of the process designated by row 1104, the third (right hand) bit of the flag is being set. As the value of that bit transitions from its cleared state (value 0) to its set state (value 1), the bit transitions through an intermediary or unknown X state. If tearing occurs at this time, the three bits of the atomic flag will have the values 0-1-X. When reading the value of the flag after such a tearing event, the memory controller (e.g., memory controller 504) might miss the tearing if the 3-bit flag is read as having the values 0-1-0, or may detect the tearing event if the 3-bit flag is read as having the value 0-1-1. In either case, memory controller is configured to determine that the flag value is set. If the tearing event is detected, the memory controller may take further action to resolve the torn memory bit and the resolution method described further below can ensure, that the flag value won't change.

In the third step of the process designated by row 1106, the third bit of the atomic flag has been successfully set. At this point the bits of the flag have the values 0-1-1. Here, although all bits have strong margins, the atomic flag has not been programmed to either its cleared or set value. When the flag is read as having the value of 0-1-1, the memory controller is programmed to determine that the flag should be considered set but the flag update got interrupted and needs to be resolved.

In the fourth step of the process designated by row 1108, the second (center) bit of the flag is being cleared. As the value of that bit transitions from its set state (value 1) to its cleared state (value 0), the bit transitions through an intermediary or unknown X state. If tearing occurs at this time, the three bits of the atomic flag will have the values 0-X-1. When reading the value of the flag after such a tearing event, the memory controller (e.g., memory controller 504) can determines that the center bit has a value of 0 or 1—the selection at this point is arbitrary.

In the fifth step of the process designated by row 1110, the second bit of the atomic flag has been successfully cleared. At this point the bits of the flag have the values 0-0-1. Here, although all bits were successfully programmed, the memory controller may determine that a tearing event has occurred because the atomic flag has not been programmed to either its cleared or set value. The memory controller can make this determination because the left and right bits do not show the same logic value. Even so, when the flag is read as having the value of 0-0-1, the memory controller is programmed to determine that the flag should be considered cleared—the center bit has a value of 0 and that state can only exist during flag clearing process when the center bit (i.e., the bit controlling the flag's value) has not successfully cleared.

In a sixth step of the process designated by row 1112, the first (left hand) bit of the flag is being set. As the value of that bit transitions from its cleared state (value 0) to its set state (value 1), the bit transitions through an intermediary or unknown X state. If tearing occurs at this time, the three bits of the atomic flag will have the values X-0-1. When reading the value of the flag after such a tearing event, the memory controller (e.g., memory controller 504) may read the left bit that was in the process of being cleared as a logic 1, which results in the flag having a value of 1-0-1, which is not distinguishable from the flag's cleared state. In this case the tearing may not be detected, but the flag value is still read as valid. In contrast, if the left bit is read as a logic 0, the flag is read as having a value of 0-0-1 and the memory controller can detect that a tearing event has occurred. The memory controller can make this determination because the left and right bits do not show the same logic value. If the tearing event is detected, the resolution strategy can determine that the flag is set as the center bit is reliable and may involve setting the first bit so that the flag has a cleared state of 1-0-1. If the tearing is missed (e.g., the flat is read as 1-0-1), the flag will simply be interpreted as being cleared without any further action being needed. Even though the left bit might be undetected weak, the flag value will not change. The situation either remains undetected (in future reading events) or if suddenly the weak left bit gets detected, the resolution can detect the weakness in the left bit, not in the center bit which reflects the flag value.

In the seventh and final step of the process designated by row 1114, the first bit of the atomic flag has been successfully cleared to a value of 0. At this point the bits of the flag have the values 1-0-1. Here, the atomic flag has been properly programmed into its cleared state and has a value of 0.

The memory controller may be programmed so that after the atomic flag has been cleared, the memory controller avoids or prevents the cleared 3-bit atomic flag from being cleared a second time. This constraint, when implemented by the memory controller, can prevent errors resulting from the last bit being programmed in the flag clearing operation being subject to a tearing event. In that event, the flag will have a value of X-0-1, where the first bit may be read as a value of 1. If that 3-bit flag were to be cleared a second time, the first step in the clearing process involves setting the third bit. If that setting operation is torn, the flag may have a resulting value of X-0-X, which is a flag condition that is invalid and may be irreparable. To avoid this condition, therefore, the memory controller may be programmed to inhibit the clearing of a cleared flag.

After clearing or setting of the 3-bit atomic flag, the memory controller (e.g., memory controller 504) can be configured to read the value of the 3-bit atomic flag in response to requests from system processor 502, which may be undertaking various system processes reliant upon the flag (e.g., a memory or operating system update).

When reading the 3-bit atomic flag, the individual values of the 3 bits making up the flag are determined and analyzed and the overall value of the flag can be determined. FIG. 12 displays a summary of how the 3-bit atomic flag would be read given particular values for each of the three bits. The first column of the table specifies a particular read value for the 3-bit flag, where X stands for a torn individual bit which might be read as a logic 0 or 1. The second column shows the interpreted flag value, which can be 0, 1, or X. X is distinguished in XL and XR to indicated which bit of the flag (e.g., the left-hand or right-hand bit) requires further resolution. The third column shows whether further action is needed or not and how the flag value should eventually get resolved. In summary, a special resolution is needed, if the left and right protection bits are not equal (rows 1206 . . . 1212). If these 2 bits are read as being equal, in a valid flag, they will reflect the inverse value of the central flag bit.

As shown in rows 1202 and 1204, if the values of the three bits are read as 1-0-1, the flag will be interpreted as being cleared and no further steps are required. This might be a well-cleared flag (row 1202) or a flag in which the left bit is only weakly cleared (X) but read as a logic 0. As the central flag bit is a strongly written, reading the flag will always result in the same flag value and is reliable.

The state in row 1204 might also be read as 0-0-1. Similarly, and as illustrated in row 1206, a strong 0 in the left bit and an X state in the central bit might give this 0-0-1 result. This is an invalid flag state indicating that a tearing event occurred while programming the 3-bit flag. Because the first bit and the center bit are read as having the same value, that indicates that one of the first and center bit has a value of X. Accordingly, the memory controller is configured to identify the weaker bit of the two. The memory controller may identify the weaker bit by performing the margin search method described above and illustrated in FIG. 8 or another equivalent method. If the margin check determines that the center bit is the weaker bit, the memory controller is configured to strengthen the center bit to a value of 0 (re-writing the logic 0) before continuing with the left bit, which is programmed to a logic value of 1. To strengthen the flag and render the flag value valid, the memory controller may also be configured so that the first bit is programmed to a set value of 1.

Rows 1210 and 1212 show how the three bits may be read if the second or center bit of the flag has an unknown or X state which is read as a logic 1 or if the third/right bit is in X state and read as a logic 1. In symmetry to the resolution of the left and central bit in a margin search, in this case, the central and right bit are to be compared in a margin search to determine which is the weaker bit. If the central bit is weaker, the memory controller strengthens the center bit by re-programming the center bit to a value of 1. Finally, the memory controller programs the right protection bit to a logic value of 0 to make the flag consistent. Once the flag is strengthened, this is needed to make the full flag consistent, in the other case, the right bit is get strengthened which also requires to write a logic 0.

Row 1214 shows how the three bits may alternatively be read if the third bit of the flag has an unknown or X state. If the third bit is read as having a value of 0, the flag is indistinguishable from the final set state shown in row 1216. Consequently, no further action will get triggered and the 3-bit flag simply gets interpreted as being set. This case is in symmetry to the cleared flag state in row 1202 or the undetected torn state in row 1204.

An advantage of this method is, that the two normal (not torn) results 1-0-1 and 0-1-0 can simply be read in a normal read mode without special attention while allowing for a direct reading of the flag value. In the event case of tearing, the same results may occur but do not require strengthening as the bit representing the flag value itself (second or central bit) is strongly set and will not change its value if being read multiple times. Two other results are possible in the event of tearing while setting the 3-bit flag and can be detected because the first and third memory bit values do not match. Hence, only in the case of tearing, dedicated resolution steps are needed.

If either the first or third bit (i.e., either of the two protection bits) is weakly programmed, the center bit is, in contrast, strongly programmed as any tearing event would have occurred when setting the first or third bit and not when setting the second or center bit and, as such, the resolutions described herein will not affect the value of the center bit. If, however, the center bit is weakly programmed, that tearing event and condition can be detected when both the first and third bits are themselves strongly programmed, but with different values. Accordingly, in this approach for reading the 3-bit flag, if the central bit is weakly programmed, tearing can be detected, as the first bit and the third bit can be strongly set to the same value. If, however one of the protection bits (i.e., the first bit or the third bit) is weakly programmed, a tearing event may not be detected, but the 3-bit flag's value will generally be stable. Consequently, any margin search performed by the memory controller can provide we do not strengthen the center flag bit in this case and instead identify the weakly programmed protection bit (i.e., the first or third bit of the flag).

In this flag implementation there are a number of invalid flag values that cannot be resolved by the memory controller. As illustrated in FIG. 12, the values 1-1-0, 1-0-0, 0-0-0, and 1-1-1 are not supposed to occur at any time in the flag when being read in normal mode. Similarly to the exceptional case for the first example using two memory bits for a flag, these cases may correspond to a broken flag and may get dealt with on system level. When performing margin search procedures to identify the weaker bit of a pair of bits in the 3-bit flag, the flag may sometimes be read as having one of the invalid flag values. In that case, a margin reduction is applied and the read operation is repeated.

The 3-bit flag, therefore, provides a scheme in which tearing events can be detected in most cases by normal read operations of the flag's protections bit—the first bit and the third bit. A tearing event might be missed if one of the protection bits is weakly written and appears to be correct in the normal read. Such missed tearing events, however, are unlikely to cause issues in the reading of the 3-bit flag because these missed events can only alter between a tearing event getting detected or not without risk of changing the overall flag value. If the protection bits are read as having different values, a tearing event has occurred. As such, tear detection can be performed without executing special margin read algorithm or further investigation into the flag values. In the particular case that the 3-bit flag's center bit was torn, as described above, a resolution approach is implemented in which the value of the torn center bit can be set arbitrarily. Furthermore, in the case that a tearing event is not detected, the failure to detect that tearing event the flag implementation provides resolutions that can eventually detect and fix that condition without arbitrarily changing the flag value.

Using this approach, a 3-bit atomic flag can be implemented by memory controller 504 in conjunction with memory array 506 that can be more robust to tearing event that conventional 1-bit flags. Using these general principles, the atomic flag can be implemented with N bits (e.g., 4, 5, 6, or more) to provide increasingly tearing-resistant flags. In that case, the programming approaches can be used in which the bits of the N-bit atomic flag are set sequentially, with a central bit (as for the 3-bit flag) or a central pair of bits (as for the 2-bit flag) representing the actual value of the atomic flag.

The present disclosure describes various implementations of tear-resistant flags. The flags may be implemented and utilized as flags to be indicator of the status of particular device functions and activities. It should be understood however, that the present approaches for implementing tear-resistant flags may be utilized to implement memory flags serving any suitable purpose. For example, instead of being used to store an indicator of the status of various system processes, the flag could instead be utilized to store data in a manner that is substantially tear resistant. As such, the systems and methods for implementing tear-resistant flags in accordance with the present disclosure may be utilized to store any Boolean values.

In some aspects, the techniques described herein relate to a system that includes a memory device including an array of non-volatile memory cells. The memory device stores a first data set. The system includes a processor configured to perform the steps of detecting a trigger event that the processor is execute a memory update operation, and executing the memory update operation by performing steps including creating a backup copy of the first data set, storing the backup copy in the memory device, and after storing the backup copy in the memory device, causing a memory controller to set a memory update flag stored in the memory device. The memory update flag includes a 2-bit value stored in a first memory cell and a second memory cell of the array of non-volatile memory cells. The memory controller is connected to the array of non-volatile memory cells and to the processor. The memory controller is configured to perform the steps of receiving a first instruction from the processor to set the memory update flag, and setting the memory update flag by performing the steps of programming the first memory cell to a first voltage value that exceeds a first threshold voltage of the first memory cell, and after programming the first memory cell to the first voltage value, programming the second memory cell to a second voltage value that is less than a second threshold voltage of the second memory cell.

The processor can be configured to perform the steps of after storing the backup copy in the memory device, modifying the first data set stored in the memory device and after modifying the first data set stored in the memory device, causing the memory controller to clear the memory update flag stored in the memory device. The memory controller may be configured to perform the steps of receiving a second instruction from the processor to clear the memory update flag, and clearing the memory update flag by performing the steps of programming the second memory cell to a third voltage value that exceeds the second threshold voltage of the second memory cell, and after programming the second memory cell to the third voltage value, programming the first memory cell to a fourth voltage value that is less than the first threshold voltage of the first memory cell. The first memory cell and the second memory cell may exhibit non-monotonic programming behavior. The first memory cell and the second memory cell may be resistive random access memory cells.

In some aspects, the techniques described herein relate to a system, including a memory device including an array of non-volatile memory cells and a memory controller connected to the array of non-volatile memory cells. The memory controller being configured to perform the steps of receiving a request to read a value of a memory flag, wherein the memory flag includes a 2-bit value stored in a first memory cell and a second memory cell of the array of non-volatile memory cells, reading a first value of the first memory cell, reading a second value of the second memory cell, and determining the value of the memory flag based on the first value and the second value.

The memory controller may be configured to perform the steps of determining that the first value stored by the first memory cell indicates the first memory cell is in a set condition, determining that the second value stored by the second memory cell indicates the second memory cell is in the set condition, and determining that the memory flag is in an unknown state based upon the first value and the second value. The memory controller may be configured to perform the steps of determining that the second memory cell is in a weaker set state than the first memory cell, and clearing the second memory cell. The memory controller may be configured to determine that the second memory cell is in the weaker set state than the first memory cell by performing a margin read operation on the first memory cell and the second memory cell. The memory controller may be configured to perform the margin read operation on the first memory cell and the second memory cell by performing the steps of applying a margin read signal to the first memory cell, wherein the margin read signal includes at least one of a voltage and a current, reading a third value of the first memory cell, determining that the third value indicates the first memory cell is in the set condition, applying the margin read signal to the second memory cell, reading a fourth value of the second memory cell, determining that the fourth value indicates the second memory cell is in a cleared condition, and clearing the second memory cell. The memory controller may be configured to perform the margin read operation on the first memory cell and the second memory cell by performing the steps of applying a first margin read signal to the first memory cell, reading a fifth value of the first memory cell, determining that the fifth value indicates the first memory cell is in a cleared condition, applying the first margin read signal to the second memory cell, reading a sixth value of the second memory cell, determining that the sixth value indicates the second memory cell is in the cleared condition, and applying a second margin read signal to the first memory cell, wherein the second margin read signal is different from the first margin read signal, reading a seventh value of the first memory cell, determining that the seventh value indicates the first memory cell is in the set condition, applying the second margin read signal to the second memory cell, reading an eighth value of the second memory cell, determining that the eighth value indicates the second memory cell is in the cleared condition, and clearing the second memory cell. The memory controller may be configured to perform the steps of determining that the first value of the first memory cell indicates the first memory cell is in a cleared condition, determining that the second value of the second memory cell indicates the second memory cell is in a set condition, and determining that the memory flag is in the cleared condition. The memory flag may include a 3-bit value stored in the first memory cell, the second memory cell, and a third memory cell of the array of non-volatile memory cells and the memory controller may be configured to perform the steps of reading a third value of the third memory cell, determining that the first value of the first memory cell indicates the first memory cell is in a set condition, determining that the second value of the second memory cell indicates the second memory cell is in a cleared condition, determining that the third value of the third memory cell indicates the third memory cell is in a set condition, and determining that the memory flag is in the set condition. The memory controller may be configured to perform the steps of receiving an instruction to set the memory flag and clearing the memory flag by performing the steps of programming the first memory cell to a first value that is greater than a first threshold value of the first memory cell, and after programming the first memory cell to the first value, programming the second memory cell to a second value that is less than a second threshold value of the second memory cell. The memory controller may be configured to perform the steps of receiving an instruction to clear the memory flag; and clearing the memory flag by performing the steps of programming the second memory cell to a third value that is greater than a first threshold value of the second memory cell, and after programming the second memory cell to the third value, programming the first memory cell to a fourth value that is less than a second threshold value of the second memory cell. The first memory cell and the second memory cell may exhibit non-monotonic programming behavior. The first memory cell and the second memory cell may be resistive random access memory cells.

In some aspects, the techniques described herein relate to a method, including receiving a request to read a value of a memory flag, wherein the memory flag includes a 2-bit value stored in a first memory cell and a second memory cell of an array of non-volatile memory cells, reading a first value of the first memory cell, reading a second value of the second memory cell, and determining the value of the memory flag based on the first value and the second value.

In some aspects, the techniques described herein relate to a method, further including: determining that the first value stored by the first memory cell indicates the first memory cell is in a set condition, determining that the second value stored by the second memory cell indicates the second memory cell is in the set condition, and determining that the memory flag is in an unknown state based upon the first value and the second value. In some aspects, the techniques described herein relate to a method, further including identifying a weaker set memory cell of the first memory cell and the second memory cell, and clearing the weaker set memory cell.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. Similarly, the description may refer to a left-hand or right-hand bit in one of the present atomic flags. It should be understood that such terms are utilized to provide a clear description of an implementation of the invention and that the various bits of the present atomic flags may be implemented in any order in memory and, in fact, the multiple bits making up the presents atomic flag could be implemented in different regions of a memory or across multiple different memory devices. Similar, the present description may describe a particular memory cell being set when having a signal value greater than a threshold and cleared when the cell's signal value is less than that threshold. It will be apparent to the person of ordinary skill in the art that such definitions may be reversed so that a particular cell may be set when its signal value falls below a threshold and the cell is cleared when its value falls above the same or a different threshold.

The present disclosure makes reference to threshold values and the determination of whether a particular memory cell is set or cleared based upon a comparison of a signal value of the memory cell to such a threshold value. As such, in embodiments, it is described that a memory cell is set when its signal value exceeds the cell's threshold. It should be understood and is expressly contemplated that the concept of "exceeding" a threshold includes the opposite configuration in which a particular memory cell is considered set when its signal value falls below (i.e., exceeds, but in a negative direction) the threshold value. Similarly, references to "falling below" a threshold are expressly contemplated to include implementations in which a particular memory cell is considered cleared when its signal value is above (i.e., falls below, in a negative direction) the threshold value.

The term "coupled" is defined as connected, although not necessarily directly, and not necessarily mechanically. The terms "a" and "an" are defined as one or more unless stated otherwise. The terms "comprise" and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. A system, comprising:
a memory device including an array of non-volatile memory cells, the memory device storing a first data set; and
a processor configured to perform the steps of:
detecting a trigger event that causes the processor to execute a memory update operation, and
executing the memory update operation by performing steps including:
creating a backup copy of the first data set,
storing the backup copy in the memory device, and
after storing the backup copy in the memory device, causing a memory controller to set a memory update flag stored in the memory device, wherein the memory update flag includes a 2-bit value stored in a first memory cell and a second memory cell of the array of non-volatile memory cells, wherein:
the memory controller is connected to the array of non-volatile memory cells and to the processor, the memory controller being configured to perform the steps of:
receiving a first instruction from the processor to set the memory update flag, and
setting the memory update flag by performing steps including:
programming the first memory cell to a first voltage value that exceeds a first threshold voltage of the first memory cell, and
after programming the first memory cell to the first voltage value, programming the second memory cell to a second voltage value that is less than a second threshold voltage of the second memory cell.

2. The system of claim 1, wherein the processor is configured to perform the steps of:
after storing the backup copy in the memory device, modifying the first data set stored in the memory device; and
after modifying the first data set stored in the memory device, causing the memory controller to clear the memory update flag stored in the memory device.

3. The system of claim 2, wherein the memory controller is configured to perform the steps of:
receiving a second instruction from the processor to clear the memory update flag, and
clearing the memory update flag by performing steps including:
programming the second memory cell to a third voltage value that exceeds the second threshold voltage of the second memory cell, and
after programming the second memory cell to the third voltage value, programming the first memory cell to a fourth voltage value that is less than the first threshold voltage of the first memory cell.

4. The system of claim 1, wherein the first memory cell and the second memory cell exhibit non-monotonic programming behavior.

5. The system of claim 1, wherein the first memory cell and the second memory cell are resistive random access memory cells.

6. A system, comprising:
a memory device including an array of non-volatile memory cells; and
a memory controller connected to the array of non-volatile memory cells, the memory controller being configured to perform the steps of:
receiving a request to read a value of a memory flag, wherein the memory flag includes a 2-bit value stored in a first memory cell and a second memory cell of the array of non-volatile memory cells;
reading a first value of the first memory cell;
reading a second value of the second memory cell; and
determining the value of the memory flag based on the first value and the second value;
determining that the first value stored by the first memory cell indicates the first memory cell is in a set condition;
determining that the second value stored by the second memory cell indicates the second memory cell is in the set condition;
determining that the memory flag is in an unknown state;
determining that the second memory cell is in a weaker set state than the first memory cell; and
clearing the second memory cell.

7. The system of claim 6, wherein the memory controller is configured to determine that the second memory cell is in a weaker set state than the first memory cell by performing a margin read operation on the first memory cell and the second memory cell.

8. The system of claim 7, wherein the memory controller is configured to perform the margin read operation on the first memory cell and the second memory cell by performing steps including:
applying a margin read signal to the first memory cell, wherein the margin read signal includes at least one of a voltage and a current;
reading a third value of the first memory cell;
determining that the third value indicates the first memory cell is in the set condition;
applying the margin read signal to the second memory cell;
reading a fourth value of the second memory cell; and
determining that the fourth value indicates the second memory cell is in a cleared condition.

9. The system of claim 7, wherein the memory controller is configured to perform the margin read operation on the first memory cell and the second memory cell by performing steps including:
applying a first margin read signal to the first memory cell;
reading a fifth value of the first memory cell;
determining that the fifth value indicates the first memory cell is in a cleared condition;
applying the first margin read signal to the second memory cell;
reading a sixth value of the second memory cell;
determining that the sixth value indicates the second memory cell is in the cleared condition; and
applying a second margin read signal to the first memory cell, wherein the second margin read signal is different from the first margin read signal;
reading a seventh value of the first memory cell;
determining that the seventh value indicates the first memory cell is in a set condition;
applying the second margin read signal to the second memory cell;
reading an eighth value of the second memory cell; and
determining that the eighth value indicates the second memory cell is in the cleared condition.

10. The system of claim 6, wherein the memory controller is configured to perform the steps of:
determining that the first value of the first memory cell indicates the first memory cell is in a cleared condition;
determining that the second value of the second memory cell indicates the second memory cell is in a set condition; and
determining that the memory flag is in the cleared condition.

11. A system, comprising:
a memory device including an array of non-volatile memory cells; and
a memory controller connected to the array of non-volatile memory cells, the memory controller being configured to perform the steps of:
receiving a request to read a value of a memory flag, wherein the memory flag includes a 2-bit value stored in a first memory cell and a second memory cell of the array of non-volatile memory cells,
reading a first value of the first memory cell,
reading a second value of the second memory cell, and
determining the value of the memory flag based on the first value and the second value;
wherein the memory flag includes a 3-bit value stored in the first memory cell, the second memory cell, and a third memory cell of the array of non-volatile memory cells and the memory controller is configured to perform the steps of:
reading a third value of the third memory cell;
determining that the first value of the first memory cell indicates the first memory cell is in a set condition;
determining that the second value of the second memory cell indicates the second memory cell is in a cleared condition;
determining that the third value of the third memory cell indicates the third memory cell is in the set condition; and
determining that the memory flag is in the cleared condition.

12. A system, comprising:
a memory device including an array of non-volatile memory cells; and
a memory controller connected to the array of non-volatile memory cells, the memory controller being configured to perform the steps of:
receiving a request to read a value of a memory flag, wherein the memory flag includes a 2-bit value stored in a first memory cell and a second memory cell of the array of non-volatile memory cells,
reading a first value of the first memory cell,
reading a second value of the second memory cell, and
determining the value of the memory flag based on the first value and the second value;
wherein the memory controller is configured to perform the steps of:
receiving a first instruction to program the memory flag to a first condition; and
program the memory flag to the first condition by performing the steps of:
programming the first memory cell to a third value that is greater than a first threshold value of the first memory cell, and
after programming the first memory cell to the third value, programming the second memory cell to a fourth value that is less than a second threshold value of the second memory cell.

13. The system of claim 12, wherein the memory controller is configured to perform the steps of:
receiving a second instruction to program the memory flag to a second condition, wherein the first condition is opposite of the second condition; and
programming the memory flag to the second condition by performing the steps of:
programming the second memory cell to a fifth value that is greater than the second threshold value of the second memory cell, and
after programming the second memory cell to the fifth value, programming the first memory cell to a sixth value that is less than the first threshold value of the first memory cell.

14. A system, comprising:
a memory device including an array of non-volatile memory cells; and
a memory controller connected to the array of non-volatile memory cells, the memory controller being configured to perform the steps of:
receiving a request to read a value of a memory flag, wherein the memory flag includes a 2-bit value stored in a first memory cell and a second memory cell of the array of non-volatile memory cells,
reading a first value of the first memory cell,
reading a second value of the second memory cell, and
determining the value of the memory flag based on the first value and the second value;
wherein the first memory cell and the second memory cell exhibit non-monotonic programming behavior.

15. A system, comprising:
a memory device including an array of non-volatile memory cells; and
a memory controller connected to the array of non-volatile memory cells, the memory controller being configured to perform the steps of:

receiving a request to read a value of a memory flag, wherein the memory flag includes a 2-bit value stored in a first memory cell and a second memory cell of the array of non-volatile memory cells,
reading a first value of the first memory cell,
reading a second value of the second memory cell, and
determining the value of the memory flag based on the first value and the second value;
wherein the first memory cell and the second memory cell are resistive random access memory cells.

16. A method, comprising:

receiving a request to read a value of a memory flag, wherein the memory flag includes a 2-bit value stored in a first memory cell and a second memory cell of an array of non-volatile memory cells;

reading a first value of the first memory cell;

reading a second value of the second memory cell;

determining the value of the memory flag based on the first value and the second value;

determining that the first value stored by the first memory cell indicates the first memory cell is in a first condition;

determining that the second value stored by the second memory cell indicates the second memory cell is in the first condition;

determining that the memory flag is in an unknown state;

identifying a weaker set memory cell of the first memory cell and the second memory cell; and clearing the weaker set memory cell.

\* \* \* \* \*